US012638772B2

(12) United States Patent
Endo et al.

(10) Patent No.: US 12,638,772 B2
(45) Date of Patent: May 26, 2026

(54) RESIST UNDERLAYER FILM-FORMING COMPOSITION

(71) Applicant: NISSAN CHEMICAL CORPORATION, Tokyo (JP)

(72) Inventors: Masahisa Endo, Toyama (JP); Hayato Hattori, Toyama (JP); Hikaru Tokunaga, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 392 days.

(21) Appl. No.: 18/560,728

(22) PCT Filed: May 16, 2022

(86) PCT No.: PCT/JP2022/020316

§ 371 (c)(1),
(2) Date: Nov. 14, 2023

(87) PCT Pub. No.: WO2022/244710

PCT Pub. Date: Nov. 24, 2022

(65) Prior Publication Data

US 2025/0085634 A1 Mar. 13, 2025

(30) Foreign Application Priority Data

May 18, 2021 (JP) ................................ 2021-083701

(51) Int. Cl.

| | |
|---|---|
| ***G03F 7/09*** | (2006.01) |
| ***C08G 65/38*** | (2006.01) |
| ***G03F 7/00*** | (2006.01) |
| ***G03F 7/40*** | (2006.01) |
| ***H10P 50/00*** | (2026.01) |

(52) U.S. Cl.

CPC ............ *G03F 7/094* (2013.01); *C08G 65/38* (2013.01); *G03F 7/40* (2013.01); *G03F 7/70008* (2013.01); *H10P 50/73* (2026.01)

(58) Field of Classification Search

CPC ....................................................... G03F 7/094

See application file for complete search history.

(56) References Cited

U.S. PATENT DOCUMENTS

| | | | | |
|---|---|---|---|---|
| 2007/0105040 | A1* | 5/2007 | Toukhy | G03F 7/095 430/270.1 |
| 2008/0206667 | A1* | 8/2008 | De | G03F 7/11 430/323 |
| 2014/0287589 | A1* | 9/2014 | Endo | H01L 21/3081 523/435 |
| 2016/0018732 | A1* | 1/2016 | Yamaguchi | G03F 7/20 430/326 |
| 2017/0351176 | A1* | 12/2017 | Yamaguchi | G03F 7/16 |
| 2018/0002561 | A1* | 1/2018 | Oomatsu | G03F 7/0002 |

FOREIGN PATENT DOCUMENTS

| | | | |
|---|---|---|---|
| JP | 2021-015205 | A | 2/2021 |
| WO | 2014/171326 | A1 | 10/2014 |

OTHER PUBLICATIONS

Jul. 19, 2022 International Search Report issued in International Patent Application No. PCT/JP2022/020316.
Nov. 21, 2023 International Preliminary Report on Patentability issued in International Patent Application No. PCT/JP2022/020316.

* cited by examiner

*Primary Examiner* — Benjamin P Sandvik
(74) *Attorney, Agent, or Firm* — Oliff PLC

(57) ABSTRACT

A novel composition for forming a resist underlayer film contains: a polymer (X) which includes structural units the same as or different from each other and having a hydroxymethyl group and a $ROCH_2$— group (R being a monovalent organic group, or a mixture of these), and a linking group linking the aforementioned structural units; and a solvent.

12 Claims, No Drawings

RESIST UNDERLAYER FILM-FORMING COMPOSITION

TECHNICAL FIELD

The present invention relates to a resist underlayer film-forming composition, a resist underlayer film that is a baked product of a coating film of the composition, and a method of manufacturing a semiconductor device using the composition.

BACKGROUND ART

In the manufacture of a semiconductor device, micromachining by a lithography process is performed. It has been known that in the lithography process, when a resist layer formed on a substrate is exposed to an ultraviolet laser such as a KrF excimer laser or an ArF excimer laser, a resist pattern having a desired shape is not formed due to the influence of a standing wave generated attributable to the reflection of the ultraviolet laser on a surface of the substrate. In order to solve the problem, a resist underlayer film (anti-reflective film) has been provided between the substrate and the resist layer. In addition, use of a novolac resin as a composition for forming a resist underlayer film has been known.

In addition, a lithography process in which at least two resist underlayer films are formed and one of the resist underlayer films is used as a mask material in order to reduce a thickness of a resist layer required according to refinement of a resist pattern has also been known. Examples of the material for forming the at least two layers include an organic resin (for example, an acrylic resin or a novolac resin), a silicon resin (for example, organopolysiloxane), and an inorganic silicon compound (for example, SiON or $SiO_2$). When dry etching is performed using a pattern formed from the organic resin layer as a mask, it is required for the pattern to have etching resistance to an etching gas (for example, fluorocarbon).

As a composition for forming such a resist underlayer film, for example, Patent Literature 1 discloses a resist underlayer film-forming composition containing: a polymer having a structural unit represented by the following Formula (1):

[Chem. 1]

(1)

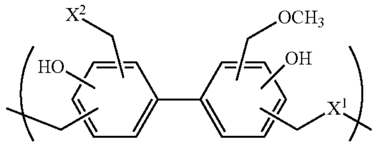

in which $X^1$ represents a divalent organic group having 6 to 20 carbon atoms having at least one aromatic ring which is optionally substituted with a halogen group, a nitro group, an amino group, or a hydroxy group, and $X^2$ represents an organic group having 6 to 20 carbon atoms having at least one aromatic ring which is optionally substituted with a halogen atom, a nitro group, an amino group, or a hydroxy group, or a methoxy group; and a solvent.

CITATION LIST

Patent Literature

Patent Literature 1: WO 2014/171326 A1

SUMMARY OF INVENTION

Technical Problem

However, a resist underlayer film-forming composition according to the related art are still unsatisfactory for such requirements as reduced amount of sublimate that would contaminate a device, and improved etching resistance in substrate processing, particularly high hardness.

Solution to Problem

The present invention is intended to solve the above problems. That is, the present invention encompasses the followings.

[1] A resist underlayer film-forming composition comprising: a solvent and a polymer (X) having structural units, which are the same as or different from each other and have a hydroxymethyl group and an $ROCH_2$— group (R is a monovalent organic group or a mixture of two or more thereof), and a linking group linking the structural units.

Preferably, R is a monovalent organic group, and in a case where more than one R is present in a single structural unit, the more than one R may be the same as or different from each other.

[2] The resist underlayer film-forming composition according to [1], wherein R is a saturated or unsaturated and linear or branched $C_2$-$C_{20}$ aliphatic hydrocarbon group or $C_3$-$C_{20}$ alicyclic hydrocarbon group, which is optionally substituted with a phenyl group, a naphthyl group, or an anthracenyl group and is optionally interrupted by an oxygen atom or a carbonyl group; a hydrogen atom; or a mixture thereof.

Preferably, R is a saturated or unsaturated and linear or branched $C_2$-$C_{20}$ aliphatic hydrocarbon group or a saturated or unsaturated and branched $C_3$-$C_{20}$ alicyclic hydrocarbon group, which is optionally substituted with a phenyl group, a naphthyl group, or an anthracenyl group and is optionally interrupted by an oxygen atom or a carbonyl group, and in a case where more than one R is present in a single structural unit, the more than one R may be the same as or different from each other.

[3] The resist underlayer film-forming composition according to [1] or [2], wherein the linking group contains an alkylene group or an ether group.

[4] The resist underlayer film-forming composition according to any one of [1] to [3], wherein the structural unit has an aromatic ring, a heterocyclic ring, or a fused ring, which optionally has a phenolic hydroxyl group and optionally has a substituted or unsubstituted amino group.

[5] The resist underlayer film-forming composition according to any one of [1] to [4], further comprising a film material (Y) capable of carrying out a crosslinking reaction with the polymer (X).

[6] The resist underlayer film-forming composition according to any one of [1] to [5], further comprising a crosslinking agent.

[7] The resist underlayer film-forming composition according to any one of [1] to [6], further comprising an acid and/or an acid generator.

[8] The resist underlayer film-forming composition according to any one of [1] to [7], further containing a surfactant.

[9] The resist underlayer film-forming composition according to any one of [1] to [8], in which the solvent includes a solvent having a boiling point of 160° C. or higher.

[10] A resist underlayer film which is a baked product of a coating film of the composition according to any one of [1] to [9].

[11] A method of manufacturing a semiconductor device, the method comprising:

forming a resist underlayer film using the composition according to any one of [1] to [9] on a semiconductor substrate;

forming a resist film on the formed resist underlayer film;

forming a resist pattern by irradiating the formed resist film with a light or electron beam and developing the resist film;

etching and patterning the resist underlayer film through the formed resist pattern; and processing the semiconductor substrate through the patterned resist underlayer film.

[12] A method of manufacturing a semiconductor device, the method comprising:

forming a resist underlayer film using the composition according to any one of [1] to [9] on a semiconductor substrate;

forming a hard mask on the formed resist underlayer film;

forming a resist film on the formed hard mask;

forming a resist pattern by irradiating the formed resist film with a light or electron beam and developing the resist film;

etching and patterning the hard mask through the formed resist pattern;

etching and patterning the resist underlayer film through the patterned hard mask; and processing the semiconductor substrate through the patterned resist underlayer film.

Advantageous Effects of Invention

According to the present invention, there is provided a novel resist underlayer film-forming composition that meets such requirements as reduced amount of sublimate that would contaminate a device, and improved etching resistance in substrate processing, particularly high hardness, while maintaining the other desirable properties.

DESCRIPTION OF EMBODIMENTS

A resist underlayer film-forming composition according to the present invention contains a solvent and a polymer (X) having structural units, which are the same as or different from each other and have a hydroxymethyl group and an $ROCH_2$— group (R is a monovalent organic group or a mixture of two or more thereof), and a linking group linking the structural units.

[Polymer (X)]

The polymer (X) has structural units, which are the same as or different from each other and have a hydroxymethyl group and an $ROCH_2$— group (R is a monovalent organic group or a mixture of two or more thereof), and a linking group linking the structural units.

R, which is a monovalent organic group, is preferably a saturated or unsaturated and linear or branched $C_2$-$C_{20}$ aliphatic hydrocarbon group or $C_3$-$C_{20}$ alicyclic hydrocarbon group, which is optionally substituted with a phenyl group, a naphthyl group, or an anthracenyl group and is optionally interrupted by an oxygen atom or a carbonyl group; a hydrogen atom; or a mixture thereof. The "mixture" means that more than one $ROCH_2$— group present in a single structural unit may be different, and also means that the more than one $ROCH_2$— group in each of two or more structural units may be different.

The typical saturated aliphatic hydrocarbon group is a linear or branched alkyl group having 2 to 20 carbon atoms, and examples thereof include an ethyl group, an n-propyl group, an i-propyl group, an n-butyl group, an i-butyl group, an s-butyl group, a t-butyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, n-hexyl, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, and a 1-methoxy-2-propyl group.

In addition, a cyclic alkyl group may also be used, and examples of a cyclic alkyl group having 3 to 20 carbon atoms include a cyclopropyl group, a cyclobutyl group, a 1-methyl-cyclopropyl group, a 2-methyl-cyclopropyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group.

The typical unsaturated aliphatic hydrocarbon group is an alkenyl group having 2 to 20 carbon atoms, and examples thereof include an ethenyl group, a 1-propenyl group, a 2-propenyl group, a 1-methyl-1-ethenyl group, a 1-butenyl group, a 2-butenyl group, a 3-butenyl group, a 2-methyl-1-propenyl group, a 2-methyl-2-propenyl group, a 1-ethylethenyl group, a 1-methyl-1-propenyl group, a 1-methyl-2-propenyl group, a 1-pentenyl group, a 2-pentenyl group, a 3-pentenyl group, a 4-pentenyl group, a 1-n-propylethenyl group, a 1-methyl-1-butenyl group, a 1-methyl-2-butenyl group, a 1-methyl-3-butenyl group, a 2-ethyl-2-propenyl group, a 2-methyl-1-butenyl group, a 2-methyl-2-butenyl group, a 2-methyl-3-butenyl group, a 3-methyl-1-butenyl group, a 3-methyl-2-butenyl group, a 3-methyl-3-butenyl group, a 1,1-dimethyl-2-propenyl group, a 1-i-propylethenyl group, a 1,2-dimethyl-1-propenyl group, a 1,2-dimethyl-2-propenyl group, a 1-cyclopentenyl group, a 2-cyclopentenyl group, a 3-cyclopentenyl group, a 1-hexenyl group, a 2-hexenyl group, a 3-hexenyl group, a 4-hexenyl group, a 5-hexenyl group, a 1-methyl-1-pentenyl group, a 1-methyl-2-pentenyl group, a 1-methyl-3-pentenyl group, a 1-methyl-4-pentenyl group, a 1-n-butylethenyl group, a 2-methyl-1-pentenyl group, a 2-methyl-2-pentenyl group, a 2-methyl-3-pentenyl group, a 2-methyl-4-pentenyl group, a 2-n-propyl-2-propenyl group, a 3-methyl-1-pentenyl group, a 3-methyl-2-pentenyl group, a 3-methyl-3-pentenyl group, a 3-methyl-4-pentenyl group, a 3-ethyl-3-butenyl group, a 4-methyl-1-pentenyl group, a 4-methyl-2-pentenyl group, a 4-methyl-3-pentenyl group, a 4-methyl-4-pentenyl group, a 1,1-dimethyl-2-butenyl group, a 1,1-dimethyl-3-butenyl group, a 1,2-dimethyl-1-butenyl group, a 1,2-dimethyl-2-butenyl group, a 1,2-dimethyl-3-butenyl group, a 1-methyl-2-ethyl-2-propenyl group, a 1-s-butylethenyl group, a 1,3-dimethyl-1-butenyl group, a 1,3-dimethyl-2-butenyl group, a 1,3-dimethyl-3-butenyl group, a 1-i-butylethenyl group, a 2,2-dimethyl-3-butenyl group, a 2,3-dimethyl-1-butenyl group, a 2,3-dimethyl-2-butenyl group, a 2,3-dimethyl-3-butenyl group, a 2-i-propyl-2-propenyl group, a 3,3-dimethyl-1-butenyl group, a 1-ethyl-1-butenyl group, a 1-ethyl-2-butenyl group, a 1-ethyl-3-butenyl group, a 1-n-propyl-1-propenyl group, a 1-n-propyl-2-propenyl group, a 2-ethyl-1-butenyl group, a 2-ethyl-2-butenyl group, a 2-ethyl-3-butenyl group, a 1,1,2-trimethyl-2-propenyl group, a 1-t-butylethenyl group, a 1-methyl-1-ethyl-2-propenyl group, a 1-ethyl-2-methyl-1-propenyl group, a 1-ethyl-2-methyl-2-propenyl group, a 1-i-propyl-1-propenyl group, a 1-i-propyl-2-propenyl group, a 1-methyl-2-cyclopentenyl group, a 1-methyl-3-cyclopentenyl group, a 2-methyl-3-cyclopentenyl group, a 2-methyl-2-cyclopentenyl group, a 2-methyl-3-cyclopentenyl group, a 2-methyl-4-cyclopentenyl group, a 2-methyl-5-cyclopentenyl group, a 2-methylene-cyclopentyl group, a 3-methyl-1-cyclopentenyl group, a 3-methyl-2-cyclopentenyl group, a 3-methyl-3-cyclopentenyl group, a 3-methyl-4-cyclopentenyl group, a 3-methyl-5-cyclopentenyl group, a 3-methylene-cyclopentyl group, a 1-cyclohexenyl group, a 2-cyclohexenyl group, and a 3-cyclohexenyl group.

The saturated aliphatic hydrocarbon group, the unsaturated aliphatic hydrocarbon group, and the cyclic alkyl group are optionally interrupted once or twice or more by an oxygen atom and/or a carbonyl group. Particularly preferably, R is a —$CH(CH_3)CH_2OCH_3$ group.

The polymer (X) may be synthesized by polymerizing a compound which has a hydroxymethyl group and optionally has a phenolic hydroxyl group, a compound which reacts with the hydroxymethyl group to provide an $ROCH_2$— group (R is a monovalent organic group or a mixture of two or more thereof), and if necessary, a compound having a functional group serving as a linking group (for example, aldehyde, ketone, and $ROCH_2$—Ar—$CH_2OR$ (R is a monovalent organic group, a hydrogen atom, or a mixture thereof)) in the presence of an acid catalyst (for example, a sulfonic acid compound).

Examples of the compound which has a hydroxymethyl group and optionally has a phenolic hydroxyl group, the compound being used for synthesis of the polymer (X), include compounds exemplified as crosslinking agents mentioned below, and the compounds shown below may be preferably used.

[Chem. 2]

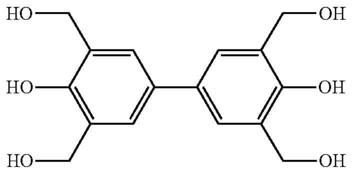

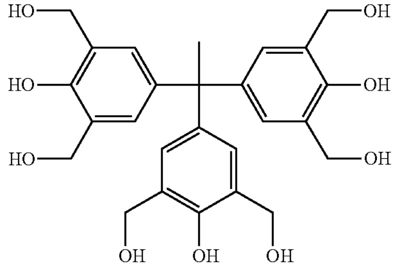

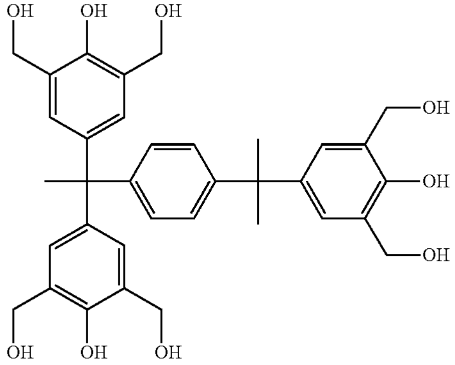

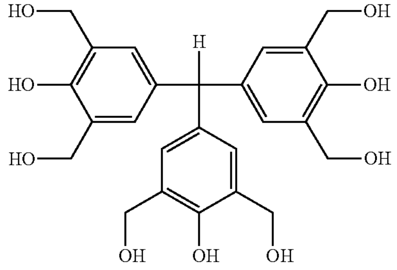

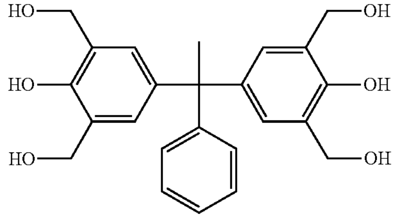

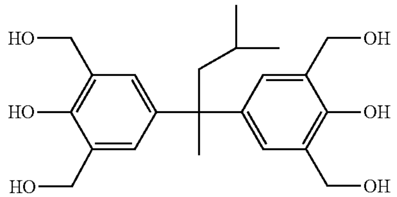

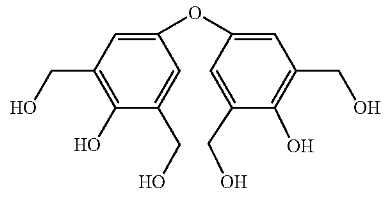

-continued

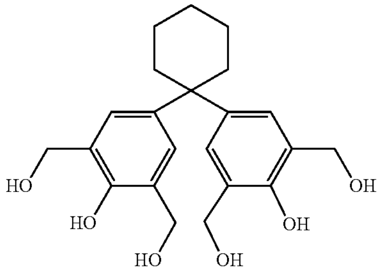

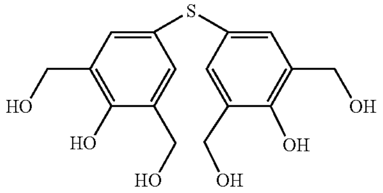

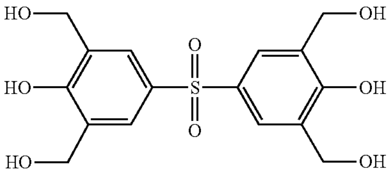

Of the examples above, the compounds shown below may be more preferably used.

[Chem. 3]

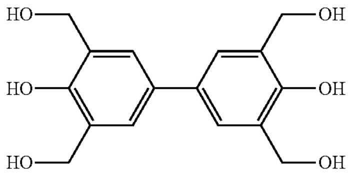

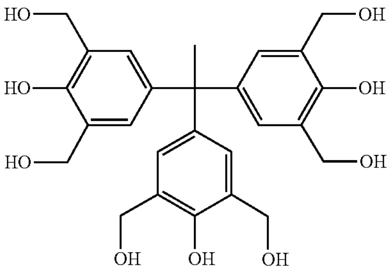

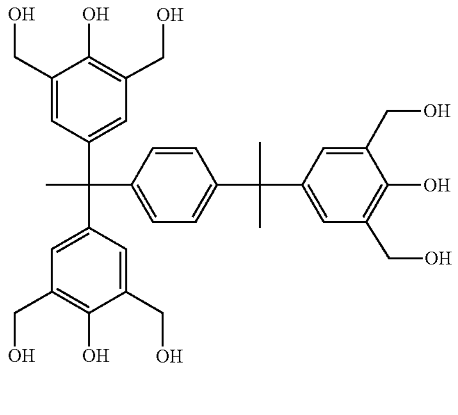

-continued

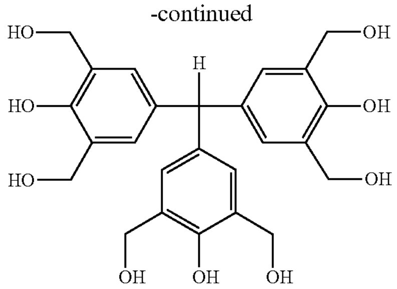

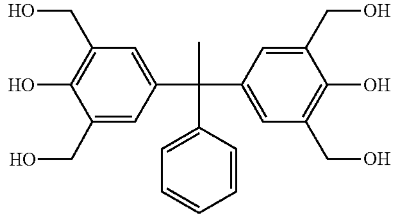

As the compound that reacts with a hydroxymethyl group used for synthesis of the polymer (X) to provide an $ROCH_2$— group (R is a monovalent organic group or a mixture of two or more thereof), an organic compound having a non-phenolic hydroxy group in the molecule is preferred. The compound may be an organic compound having a functional group that may be chemically changed into a non-phenolic hydroxy group even when it does not originally have a non-phenolic hydroxy group in the molecule, for example, an alkoxy group (—OR), an aldehyde group (—CHO), a carboxyl group (—COOH), an ester group (—COOR), or a ketone group (—COR). The non-phenolic hydroxy groups or functional groups that may be chemically changed into non-phenolic hydroxy groups may be present in the molecule in a number of one or two or more. The organic compound may be an aliphatic hydrocarbon (preferably having 10 or fewer carbon atoms), an alicyclic hydrocarbon (preferably having 20 or fewer carbon atoms), or an aromatic hydrocarbon (for example, having an α-carbon having at least one aliphatic hydroxy group). Examples thereof include propylene glycol monomethyl ether, propylene glycol monomethyl ether acetate, an aliphatic alcohol (example, n-butanol), a compound represented by Ar—$CH_2OH$ (Ar is, for example, benzene, naphthalene, anthracene, pyrene, fluorene, or m-terphenyl), aldehyde, ketone, and a methylol compound.

Examples of the organic compound having an aldehyde group include aliphatic aldehydes such as formaldehyde, paraformaldehyde, butyraldehyde, and crotonaldehyde; and aromatic aldehydes such as furfural, pyridinecarboxyaldehyde, benzaldehyde, naphthylaldehyde, anthraldehyde, phenanthrylaldehyde, salicylaldehyde, phenylacetaldehyde, biphenyl aldehyde, 3-phenylpropionaldehyde, tolylaldehyde, (N,N-dimethylamino)benzaldehyde, acetoxybenzaldehyde, 1-pyrenecarboxaldehyde, and anisaldehyde.

Examples of the organic compound having a ketone group include diaryl ketones such as diphenyl ketone, phenyl naphthyl ketone, dinaphthyl ketone, phenyltolyl ketone, ditolyl ketone, 9-fluorenone, anthraquinone, and acenaphthaquinone, and spiroketones such as 11H-benzo[b]fluoren-11-one, 9H-tribenzo[a,f,l]trinden-9,14,15-trione, and indeno[1,2-b]fluoren-6,12-dione.

The structural unit of the polymer (X) that may be obtained as described above preferably has an aromatic ring, a heterocyclic ring, or a fused ring which optionally has a phenolic hydroxy group and optionally has a substituted or unsubstituted amino group. The aromatic ring is preferably a benzene ring. In addition, the linking group linking the more than one structural unit preferably contains an alkylene group or an ether group.

The compound used for synthesis of the polymer (X) is not limited to one compound, and two or more compounds may be used in combination. However, the more than one structural unit having a hydroxymethyl group and an $ROCH_2$— group (R is a monovalent organic group or a mixture of two or more thereof) may be the same as or different from each other.

The weight average molecular weight of the polymer (X) contained in the resist underlayer film-forming composition of the present invention is not particularly limited. The weight average molecular weight of the polymer (X) is, for example, 1,000 or more or 2,000 or more, and for example, 500,000 or less or 100,000 or less, in terms of standard polystyrene.

[Solvent]

The resist underlayer film-forming composition of the present invention may be prepared by dissolving the respective components in an appropriate solvent, and is used in a uniform solution state.

Examples of such a solvent include ethylene glycol monomethyl ether, ethylene glycol monoethyl ether, diethylene glycol monomethyl ether, diethylene glycol monoethyl ether, propylene glycol, propylene glycol monomethyl ether, propylene glycol monopropyl ether, propylene glycol monomethyl ether acetate, propropylene glycol propyl ether acetate, methyl cellosolve acetate, ethyl cellosolve acetate, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, N,N-dimethylformamide, N,N-dimethylacetamide, and N-methylpyrrolidone.

Furthermore, a high-boiling point solvent having a boiling point of 180° C. or higher may be used. Specific examples of the high-boiling point solvent include 1-octanol, 2-ethylhexanol, 1-nonanol, 1-decanol, 1-undecanol, ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, tripropylene glycol, glycerin, n-nonyl acetate, ethylene glycol monohexyl ether, ethylene glycol mono-2-ethylhexyl ether, ethylene glycol monophenyl ether, ethylene glycol monobenzyl ether, diethylene glycol monoethyl ether, diethylene glycol monoisopropyl ether, diethylene glycol mono-n-butyl ether, diethylene glycol monoisobutyl ether, diethylene glycol monohexyl ether, diethylene glycol monophenyl ether, diethylene glycol monobenzyl ether, diethylene glycol diethyl ether, diethylene glycol dibutyl ether, diethylene glycol butylmethyl ether, triethylene glycol dimethyl ether, triethylene glycol monomethyl ether, triethylene glycol-n-butyl ether, triethylene glycol butylmethyl ether, triethylene glycol diacetate, tetraethylene glycol dimethyl ether, dipropylene glycol monomethyl ether, dipropylene glycol mono-n-propyl ether, dipropylene glycol mono-n-butyl ether, tripropylene glycol dimethyl ether, tripropylene glycol monomethyl ether, tripropylene glycol mono-n-propyl ether, tripropylene glycol mono-n-butyl ether, ethylene glycol monoethyl ether acetate, ethylene glycol monobutyl ether acetate, diethylene glycol monomethyl ether acetate, diethylene glycol monoethyl ether acetate, diethylene glycol monobutyl ether acetate, triacetin, propylene glycol diacetate, dipropylene glycol monomethyl ether acetate, dipropylene glycol methyl-n-propyl ether, dipropylene glycol methyl ether acetate, 1,4-butanediol diacetate, 1,3-butylene glycol diacetate, 1,6-hexanediol diacetate, triethylene glycol diacetate, γ-butyrolactone, dihexyl malonate, diethyl succinate, dipropyl succinate, dibutyl succinate, dihexyl succinate, dimethyl adipate, diethyl adipate, and dibutyl adipate.

These solvents may be used each alone or in combination of two or more thereof. The ratio of the solid content obtained by removing the organic solvent from the composition is, for example, within the range of 0.5% by mass to 30% by mass and preferably 0.8% by mass to 15% by mass.

In addition, the following compound described in WO 2018/131562 A1 may be used.

[Chem. 4]

Formula (i)

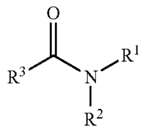

In Formula (i), $R^1$, $R^2$, and $R^3$ each represent an alkyl group having 1 to 20 carbon atoms which is optionally interrupted by a hydrogen atom, an oxygen atom, a sulfur atom, or an amide bond, may be the same as or different from each other, and may be bonded to each other to form a ring structure.

Examples of the alkyl group having 1 to 20 carbon atoms include a linear or branched alkyl group which may have or may not have a substituent, and examples thereof include a methyl group, an ethyl group, an n-propyl group, an isopropyl group, an n-butyl group, a sec-butyl group, a tert-butyl group, an n-pentyl group, an isopentyl group, a neopentyl group, an n-hexyl group, an isohexyl group, an n-heptyl group, an n-octyl group, a cyclohexyl group, a 2-ethylhexyl group, an n-nonyl group, an isononyl group, a p-tert-butylcyclohexyl group, an n-decyl group, an n-dodecylnonyl group, an undecyl group, a dodecyl group, a tridecylic group, a tetradecyl group, a pentadecyl group, a hexadecyl group, a heptadecyl group, an octadecyl group, a nonadecyl group, and an eicosyl group. The alkyl group is preferably an alkyl group having 1 to 12 carbon atoms, more preferably an alkyl group having 1 to 8 carbon atoms, and still more preferably an alkyl group having 1 to 4 carbon atoms.

Examples of the alkyl group having 1 to 20 carbon atoms which is optionally interrupted by an oxygen atom, a sulfur atom, or an amide bond include alkyl groups containing a structural unit $—CH_2—O—$, $—CH_2—S—$, $—CH_2—NHCO—$, or $—CH_2—CONH—$. —O—, —S—, —NHCO—, or —CONH— may be one unit or two or more units in the alkyl group. Specific examples of the alkyl group having 1 to 20 carbon atoms which is interrupted by an —O—, —S—, —NHCO—, or —CONH— unit include a methoxy group, an ethoxy group, a propoxy group, a butoxy group, a methylthio group, an ethylthio group, a propylthio group, a butylthio group, a methylcarbonylamino group, an ethylcarbonylamino group, a propylcarbonylamino group, a butylcarbonylamino group, a methylaminocarbonyl group, an ethylaminocarbonyl group, a propylaminocarbonyl group, and a butylaminocarbonyl group; and may further include a methyl group, an ethyl group, a propyl group, a butyl group, a pentyl group, a hexyl group, a heptyl group, an octyl group, a nonyl group, a decyl group, a dodecyl group, and an octadecyl group, in which each of them is substituted with a methoxy group, an ethoxy group, a propoxy group, a butoxy group, a methylthio group, an ethylthio group, a propylthio group, a butylthio group, a methylcarbonylamino group, an ethylcarbonylamino group, a methylaminocarbonyl group, an ethylaminocarbonyl group, or the like. The alkyl group is preferably a methoxy group, an ethoxy group, a methylthio group, or an ethylthio group, and more preferably a methoxy group or an ethoxy group.

Because these solvents have a relatively high boiling point, they are also effective for imparting high embeddability and high flatness to the resist underlayer film-forming composition.

Specific examples of a preferred compound represented by Formula (i) are shown below.

[Chem. 5]

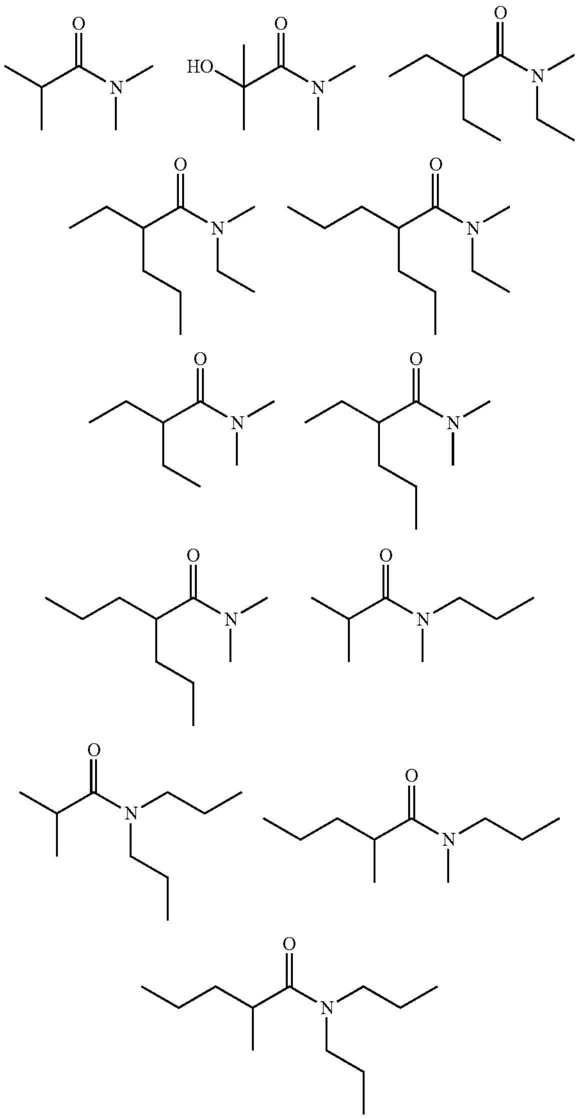

-continued

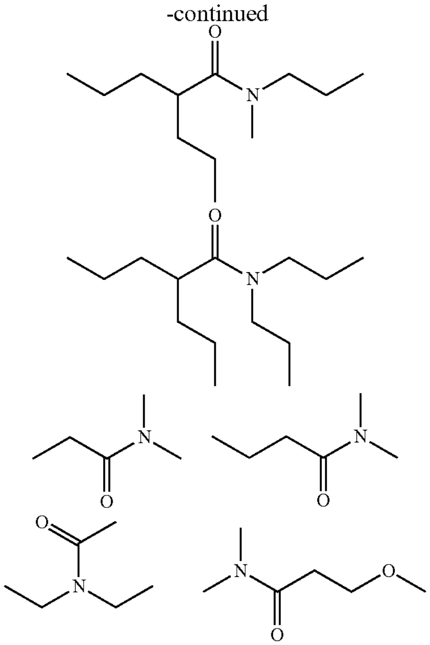

Of these, 3-methoxy-N,N-dimethylpropionamide, N,N-dimethylisobutylamide, and a compound represented by the following formula:

[Chem. 6]

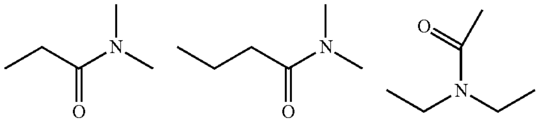

are preferred, and a particularly preferred compound represented by Formula (i) is 3-methoxy-N,N-dimethylpropionamide or N,N-dimethylisobutylamide.

These solvents may be used each alone or in combination of two or more thereof. Of these solvents, a solvent having a boiling point of 160° C. or higher is preferred, and propylene glycol monomethyl ether, propylene glycol monomethyl ether acetate, ethyl lactate, butyl lactate, cyclohexanone, 3-methoxy-N,N-dimethylpropionamide, N,N-dimethylisobutylamide, 2,5-dimethylhexan-1,6-diyldiacetate (DAH, cas, 89182-68-3), 1,6-diacetoxyhexane (cas, 6222-17-9), and the like are preferred. In particular, propylene glycol monomethyl ether, propylene glycol monomethyl ether acetate, and N,N-dimethylisobutylamide are preferred.

[Optional Component]

The resist underlayer film-forming composition of the present invention may further contain at least one of a crosslinking agent, an acid and/or an acid generator, a thermal acid generator, and a surfactant, as an optional component.

(Crosslinking Agent)

The resist underlayer film-forming composition of the present invention may further contain a crosslinking agent (here, the crosslinking agent is not the same as the polymer X). As the crosslinking agent, a crosslinkable compound having at least two crosslink-forming substituents is preferably used. Examples thereof include a melamine-based compound, a substituted urea-based compound, a phenol-based compound having a crosslink-forming substituent such as a methylol group or a methoxymethyl group, and a polymer-based crosslinkable compound thereof. Specifically, the crosslinking agent is a compound such as methoxymethylated glycoluril, butoxymethylated glycoluril, methoxymethylated melamine, butoxymethylated melamine, methoxymethylated benzoguanamine, or butoxymethylated benzoguanamine, and examples thereof include tetramethoxymethyl glycoluril, tetrabutoxymethyl glycoluril, and hexamethoxymethylmelamine. Furthermore, the substituted urea-based compound is methoxymethylated urea, butoxymethylated urea, or methoxymethylated thiourea, and examples thereof include tetramethoxymethyl urea and tetrabutoxymethyl urea. In addition, condensates of these compounds may also be used. Examples of the phenol-based compound include tetrahydroxymethylbiphenol, tetramethoxymethylbiphenol, tetrahydroxymethylbisphenol, tetramethoxymethylbisphenol, and compounds represented by the following formulas.

[Chem. 7]

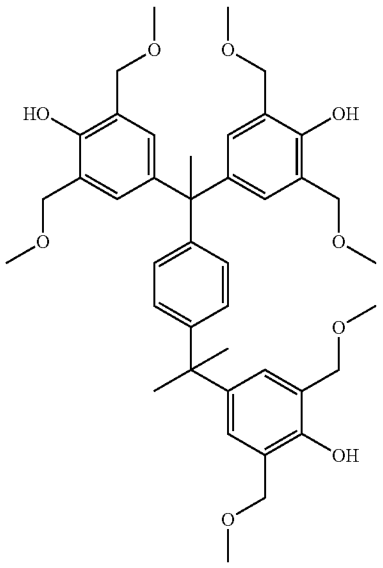

HMOM-TPPA

[Chem. 8]

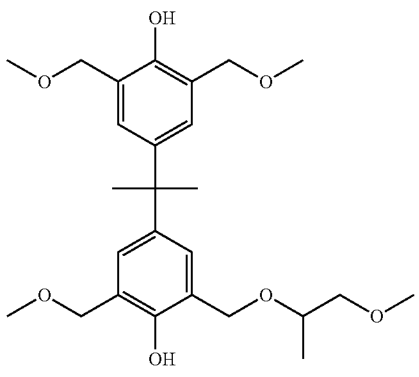

-continued

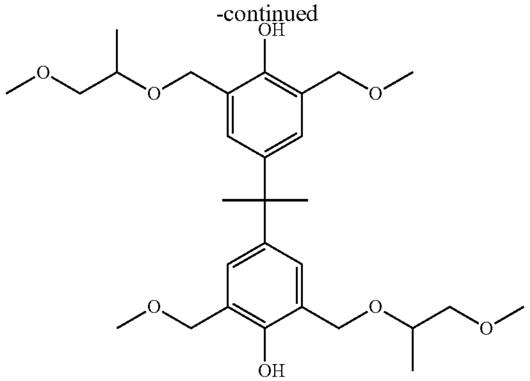

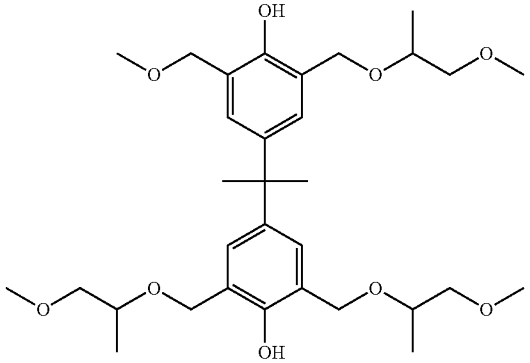

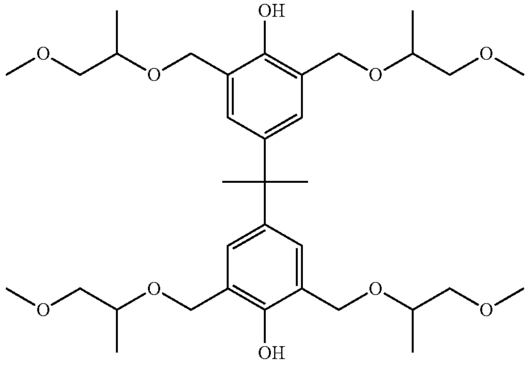

In addition, as the crosslinking agent, a compound having at least two epoxy groups may also be used. Examples of such a compound include tris(2,3-epoxypropyl)isocyanurate, 1,4-butanediol diglycidyl ether, 1,2-epoxy-4-(epoxyethyl)cyclohexane, glycerol triglycidyl ether, diethylene glycol diglycidyl ether, 2,6-diglycidyl phenyl glycidyl ether, 1,1,3-tris[p-(2,3-epoxypropoxy)phenyl]propane, 1,2-cyclohexanedicarboxylic acid diglycidyl ester, 4,4'-methylenebis (N,N-diglycidylaniline), 3,4-epoxycyclohexylmethyl-3,4-epoxycyclohexane carboxylate, trimethylolethane triglycidyl ether, bisphenol-A-diglycidyl ether, EPOLEAD [registered trademark] GT-401, GT-403, GT-301, and GT-302 and CELLOXIDE [registered trademark]2021 and 3000, manufactured by Daicel Corporation; 1001, 1002, 1003, 1004, 1007, 1009, 1010, 828, 807, 152, 154, 180575, 871, and 872, manufactured by Mitsubishi Chemical Corporation, EPPN 201 and 202, EOCN-102, 1035, 1045, 1020, 1025, and 1027, manufactured by Nippon Kayaku Co., Ltd., Denacol [registered trademark] EX-252, EX-611, EX-612, EX-614, EX-622, EX-411, EX-512, EX-522, EX-421, EX-313, EX-314, and EX-321, manufactured by Nagase ChemteX Corporation, CY175, CY177, CY179, CY182, CY184, and CY192, manufactured by BASF Japan Ltd., and EPICLON 200, 400, 7015, 835LV, and 850CRP, manufactured by DIC Corporation. In addition, as the compound having at least two epoxy groups, an epoxy resin having an amino group can also be used. Examples of the epoxy resin include YH-434 and YH-434L (manufactured by NIPPON STEEL Epoxy Manufacturing Co., Ltd.).

In addition, as the crosslinking agent, a compound having at least two block isocyanate groups may also be used. Examples of such a compound include TAKENATE [registered trademark] B-830 and B-870N, manufactured by Mitsui Chemicals, Inc. and VESTANAT [registered trademark] B1358/100, manufactured by Evonik Degussa GmbH.

In addition, as the crosslinking agent, a compound having at least two vinyl ether groups may also be used. Examples of such a compound include bis(4-(vinyloxymethyl)cyclohexylmethyl)glutarate, tri(ethyleneglycol)divinyl ether, adipic acid divinyl ester, diethylene glycol divinyl ether, 1,2,4-tris(4-vinyloxybutyl)trimellitate, 1,3,5-tris(4-vinyloxybutyl)trimellitate, bis(4-(vinyloxy)butyl) terephthalate, bis(4-(vinyloxy)butyl)isophthalate, ethylene glycol divinyl ether, 1,4-butanediol divinyl ether, tetramethylene glycol divinyl ether, tetraethylene glycol divinyl ether, neopentyl glycol divinyl ether, trimethylolpropane trivinyl ether, trimethylolethane trivinyl ether, hexanediol divinyl ether, 1,4-cyclohexanediol divinyl ether, tetraethylene glycol divinyl ether, pentaerythritol divinyl ether, pentaerythritol trivinyl ether, and cyclohexanedimethanol divinyl ether.

In addition, as the crosslinking agent, a crosslinking agent having high heat resistance may be used. As the crosslinking agent having high heat resistance, a compound having a crosslink-forming substituent having an aromatic ring (for example, a benzene ring or a naphthalene ring) in the molecule may be preferably used.

Examples of the compound include a compound having a partial structure of the following Formula (4) and a polymer or an oligomer having a repeating unit of the following Formula (5).

[Chem. 9]

Formula (4)

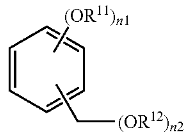

Formula (5)

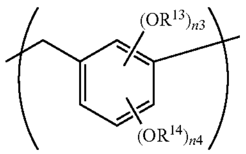

Each of $R^{11}$, $R^{12}$, $R^{13}$, and $R^{14}$ is a hydrogen atom or an alkyl group having 1 to 10 carbon atoms, and examples described above may be used for these alkyl groups. n1 is an integer of 1 to 4, n2 is an integer of 1 to (5−n1), and (n1+n2) represents an integer of 2 to 5. n3 is an integer of 1 to 4, n4 is 0 to (4−n3), and (n3+n4) represents an integer of 1 to 4. The oligomer and the polymer can be used in a range of the number of repeating units of 2 to 100 or 2 to 50.

Examples of the compound, the polymer, and the oligomer of Formulas (4) and (5) include the followings.

[Chem. 10]

Formula (4-1)

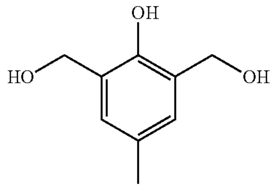

Formula (4-2)

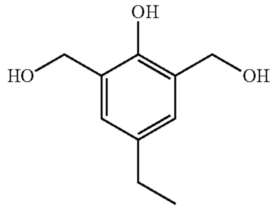

Formula (4-3)

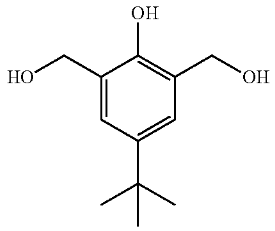

Formula (4-4)

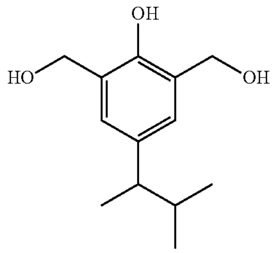

Formula (4-5)

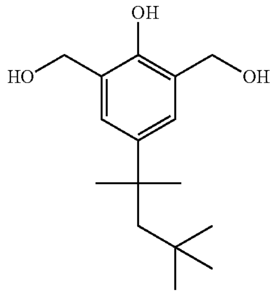

Formula (4-6)

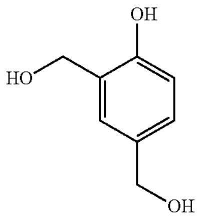

-continued
Formula (4-7)
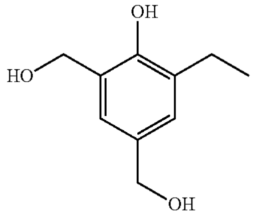
Formula (4-8)
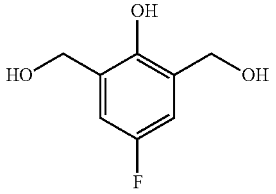
Formula (4-9)
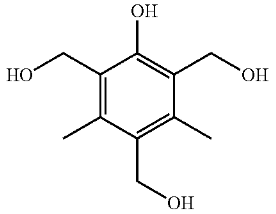
Formula (4-10)
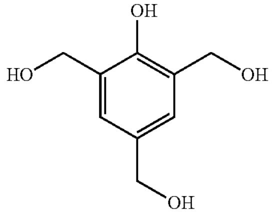
Formula (4-11)
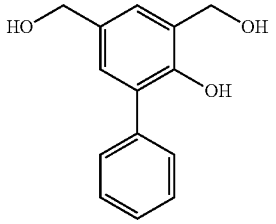
Formula (4-12)
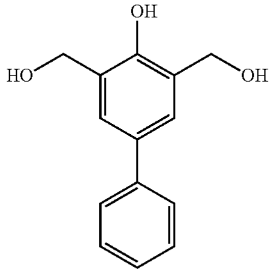
Formula (4-13)
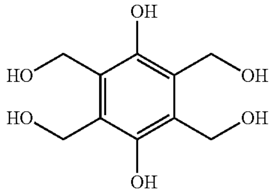
-continued
Formula (4-14)
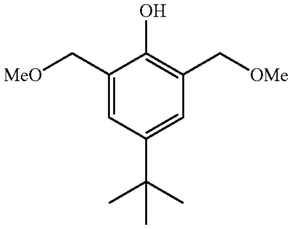
Formula (4-15)
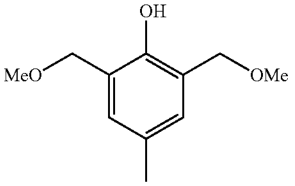
[Chem. 11]
(Formula (4-16)
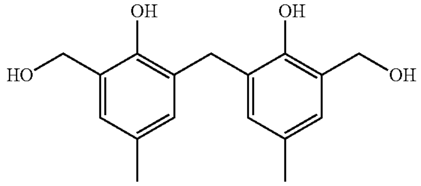
(Formula (4-17)
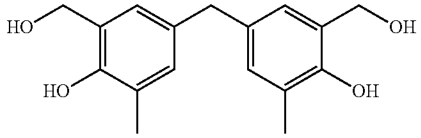
(Formula (4-18)
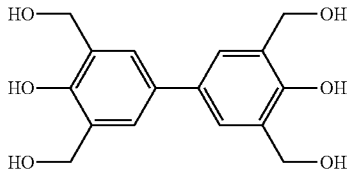
(Formula (4-19)
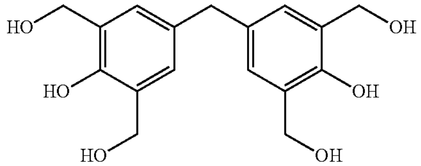
(Formula (4-20)
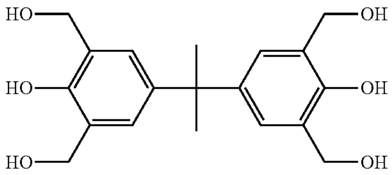

-continued (Formula (4-21))

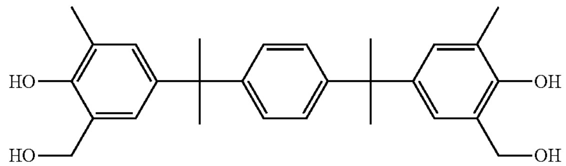

(Formula (4-22))

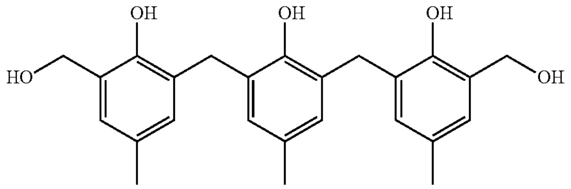

Formula (4-23)

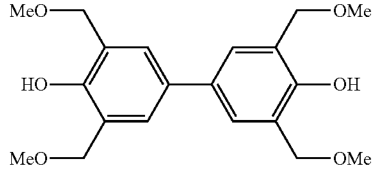

(Formula (4-24))

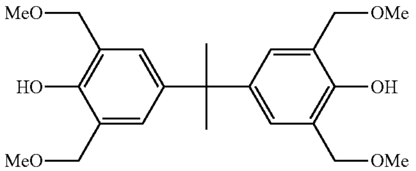

(Formula (4-25))

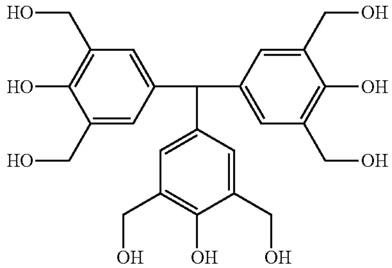

(Formula (4-26))

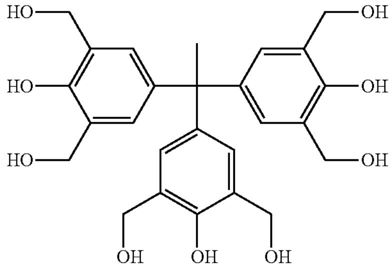

(Formula (4-27))

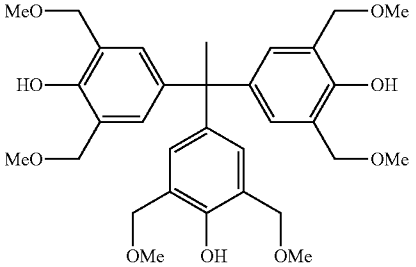

-continued

[Chem. 12]

Formula (4-28)

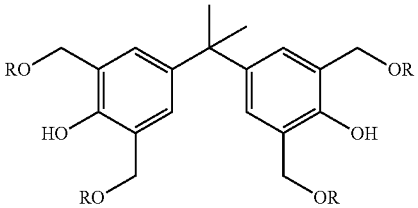

R: —H or —$CH(CH_3)CH_2OCH_3$

The compounds are available as products from ASAHI YUKIZAI CORPORATION and Honshu Chemical Industry Co., Ltd. Of the crosslinking agents, for example, the compound of Formula (4-23) is available as TMOM-BP (trade name) from Honshu Chemical Industry Co., Ltd., the compound of Formula (4-24) is available as TM-BIP-A (trade name) from ASAHI YUKIZAI CORPORATION, and the compound of Formula (4-28) is available as PGME-BIP-A (trade name) from Japan Finechem Company, Inc.

The amount of crosslinking agent added varies depending on an application solvent to be used, a substrate to be used, a solution viscosity to be required, a film shape to be required, or the like. The amount of crosslinking agent added is 0.001% by mass or more, 0.01% by mass or more, 0.05% by mass or more, 0.5% by mass or more, or 1.0% by mass or more, and 80% by mass or less, 50% by mass or less, 40% by mass or less, 20% by mass or less, or 10% by mass or less, with respect to the total solid content. The crosslinking agent may cause a crosslinking reaction due to self-condensation. However, in a case where a crosslinkable substituent is present in the polymer of the present invention, the crosslinking agent may cause crosslinking reaction with the crosslinkable substituent.

One crosslinking agent selected from these crosslinking agents may be added, and a combination of two or more crosslinking agents may be added.

(Acid and/or Acid Generator)

The resist underlayer film-forming composition according to the present invention may contain an acid and/or an acid generator.

Examples of the acid include carboxylic acid compounds such as p-toluene sulfonic acid, trifluoromethane sulfonic acid, pyridinium p-toluene sulfonic acid, pyridinium phenol sulfonic acid, salicylic acid, 5-sulfosalicylic acid, 4-phenol sulfonic acid, camphor sulfonic acid, 4-chlorobenzene sulfonic acid, benzene disulfonic acid, 1-naphthalen sulfonic acid, citric acid, benzoic acid, hydroxy benzoic acid, and naphthalene carboxylic acid, and inorganic acids such as hydrochloric acid, sulfuric acid, nitric acid, and phosphoric acid.

As the acid, only a single species of an acid may be used, or two or more species of acids may be used in combination. A blending amount is usually within the range of 0.0001 to 20% by mass, preferably 0.0005 to 10% by mass, and more preferably 0.01 to 5% by mass, with respect to the total solid content.

Examples of the acid generator include a thermal acid generator and a photoacid generator.

Examples of the thermal acid generator include 2,4,4,6-tetrabromocyclohexadienone, benzoin tosylate, 2-nitrobenzyl tosylate, K-PURE [registered trademark] CXC-1612, CXC-1614, TAG-2172, TAG-2179, TAG-2678, TAG2689, and TAG2700 (manufactured by King Industries Inc.), SI-45, SI-60, SI-80, SI-100, SI-110, and SI-150 (manufactured by SANSHIN CHEMICAL INDUSTRY CO., LTD.), quaternary ammonium salts of trifluoroacetate, and organic sulfonic acid alkyl esters.

Examples of the onium salt compound include iodonium salt compounds such as diphenyliodoniumhexafluorophosphate, diphenyliodoniumtrifluoromethanesulfonate, diphenyliodoniumnonafluoro n-butane sulfonate, diphenyliodoniumperfluoro n-octane sulfonate, diphenyliodoniumcamphorsulfonate, bis(4-tert-butylphenyl)iodoniumcamphorsulfonate, and bis(4-tert-butylphenyl) iodoniumtrifluoromethanesulfonate; and sulfonium salt compounds such as triphenylsulfoniumhexafluoroantimonate, triphenylsulfoniumnonafluoro n-butane sulfonate, triphenylsulfoniumcamphorsulfonate, and triphenylsulfoniumtrifluoromethanesulfonate.

Examples of the sulfonimide compound include N-(trifluoromethanesulfonyloxy)succinimide, N-(nonafluoro n-butanesulfonyloxy)succinimide, N-(camphorsulfonyloxy)succinimide, and N-(trifluoromethanesulfonyloxy) naphthalimide.

Examples of the disulfonyldiazomethane compound include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyldiazomethane.

As the acid generator, only a single species of an acid generator may be used, or two or more species of acid generators may be used in combination.

In a case where the acid generator is used, a ratio thereof is within the range of 0.01 to 10 parts by mass, 0.1 to 8 parts by mass, or 0.5 to 5 parts by mass, with respect to 100 parts by mass of the solid content of the resist underlayer film-forming composition.

(Surfactant)

The resist underlayer film-forming composition of the present invention may further contain a surfactant. Examples of the surfactant include nonionic surfactants such as polyoxyethylene alkyl ethers such as polyoxyethylene lauryl ether, polyoxyethylene stearyl ether, polyoxyethylene cetyl ether, and polyoxyethylene oleyl ether, polyoxyethylene alkylallyl ethers such as polyoxyethylene octylphenyl ether and polyoxyethylene nonylphenyl ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine-based surfactants such as EFTOP [registered trademark] EF301, EF303, and EF352 (manufactured by Mitsubishi Materials Electronic Chemicals Co., Ltd.), MEGAFACE [registered trademark] F171, F173, R-30, R-30-N, R-40, and R-40-LM (manufactured by DIC Corporation), Fluorad FC430 and FC431 (manufactured by Sumitomo 3M Limited), AsahiGuard [registered trademark] AG710 and Surflon [registered trademark] S-382, SC101, SC102, SC103, SC104, SC105, and SC106 (manufactured by AGC Inc.); and Organosiloxane polymer KP341 (manufactured by Shin-Etsu Chemical Co., Ltd.). One surfactant selected from these crosslinking agents may be added, and a combination of two or more crosslinking agents may be added. A content ratio the surfactant is, for example, within the range of 0.01% by mass to 5% by mass with respect to the solid content obtained by removing a solvent described below from the resist underlayer film-forming composition of the present invention.

[Film Material (Y)]

The polymer (X) according to the present invention may be used as a crosslinking agent of the film material (Y). That is, the resist underlayer film-forming composition according to the present invention further contains a film material (Y) capable of carrying out a crosslinking reaction with the polymer (X). It may be said that the film material (Y) is a film material capable of carrying out a crosslinking reaction with the polymer (X).

The film material (Y) optionally used in the present invention may be used without particular limitation as long as it is a material capable of carrying out a crosslinking reaction with the polymer (X). The film material may be a polymer, an oligomer, or a low-molecular-weight compound having a molecular weight of 1,000 or less. Examples of a crosslink-forming group present in the film material include a hydroxy group, a carboxyl group, an amino group, and an alkoxy group, but are not limited thereto.

More specifically, the film materials (a) to (z) disclosed in the section of [Firm material (Y)] of the specification of JP 2020-033333 A (WO 2021/172295 A1) may be exemplified.

The film material (Y) capable of carrying out a crosslinking reaction preferably includes at least one member selected from the group consisting of:

- a film material (Y1) containing an aliphatic ring (for example, (a));
- a novolac film material (Y2) (for example, (b), (c), (d), (e), (f), (g), (h), (i), (j), (k), and (l));
- a polyether film material (Y3) (for example, (z));
- a polyester film material (Y4) (for example, (o) and (p));
- a compound (Y5) different from the crosslinkable compound (A) (for example, (n), (r), (s), (t), (u), (v), (w), (x), and (y));
- a film material containing an aromatic fused ring (Y6) (for example, (q));
- an acrylic resin (Y7); and
- a methacrylic resin (Y8).

In a case where the resist underlayer film-forming composition according to the present invention contains a film material (Y) capable of carrying out a crosslinking reaction (a film material or a polymer), the content ratio of the film material (Y) capable of carrying out a crosslinking reaction is generally within the range of 1 to 99.9% by mass, preferably 50 to 99.9% by mass, more preferably 50 to 95% by mass, and still more preferably 50 to 90% by mass, with respect to a total solid content.

A light absorber, a rheology modifier, an adhesion assistant, or the like may be further added to the resist underlayer film-forming composition of the present invention. The rheology modifier is effective in improving fluidity of the underlayer film-forming composition. The adhesion assistant is effective in improving adhesion between the semiconductor substrate or the resist and the underlayer film.

(Light Absorber)

As the light absorber, commercially available light absorbers described in "Technique and Market of Industrial Pigments" (CMC Publishing Co., Ltd.) or "Dye Handbook" (edited by The Society of Synthetic Organic Chemistry, Japan), such as C.I. Disperse Yellow 1, 3, 4, 5, 7, 8, 13, 23, 31, 49, 50, 51, 54, 60, 64, 66, 68, 79, 82, 88, 90, 93, 102, 114 and 124; C.I. Disperse Orange 1, 5, 13, 25, 29, 30, 31, 44, 57, 72 and 73; C.I. Disperse Red 1, 5, 7, 13, 17, 19, 43, 50, 54, 58, 65, 72, 73, 88, 117, 137, 143, 199 and 210; C.I. Disperse Violet 43; C.I. Disperse Blue 96; C.I. Fluorescent Brightening Agent 112, 135 and 163; C.I. Solvent Orange 2 and 45; C.I. Solvent Red 1, 3, 8, 23, 24, 25, 27 and 49; C.I. Pigment Green 10; and C.I. Pigment Brown 2, may be suitably used. The light absorber is usually incorporated in a ratio of 10% by mass or less, and preferably 5% by mass or less, with respect to the total solid content of the resist underlayer film-forming composition.

(Rheology Modifier)

The rheology modifier is added mainly to improve the fluidity of the resist underlayer film-forming composition, and in particular, to improve the thickness uniformity of the resist underlayer film or to enhance the filling properties of the resist underlayer film-forming composition into a hole in a baking step. Specific examples thereof include phthalic acid derivatives such as dimethyl phthalate, diethyl phthalate, diisobutyl phthalate, dihexyl phthalate, and butylisodecyl phthalate; adipic acid derivatives such as di-n-butyl adipate, diisobutyl adipate, diisooctyl adipate, and octyldecyl adipate; maleic acid derivatives such as di-n-butyl maleate, diethyl maleate, and dinonyl maleate; oleic acid derivatives such as methyl oleate, butyl oleate, and tetrahydrofurfuryl oleate; and stearic acid derivatives such as n-butyl stearate and glyceryl stearate. These rheology modifiers are usually incorporated in a ratio of less than 30% by mass with respect to the total solid content of the resist underlayer film-forming composition.

(Adhesion Assistant)

The adhesion assistant is mainly added to improve adhesion of the resist underlayer film-forming composition to a substrate or a resist, and in particular, to prevent peeling off of the resist during development. Specific examples thereof include chlorosilanes such as trimethylchlorosilane, dimethylmethylolchlorosilane, methyldiphenylchlorosilane, and chloromethyldimethylchlorosilane; alkoxysilanes such as trimethylmethoxysilane, dimethyldiethoxysilane, methyldimethoxysilane, dimethylmethylolethoxysilane, diphenyldimethoxysilane, and phenyltriethoxylsilane; silazanes such as hexamethyldisilazane, N,N'-bis(trimethylsilyl)urea, dimethyltrimethylsilylamine, and trimethylsilylimidazole; silanes such as methyloltrichlorosilane, γ-chloropropyltrimethoxysilane, γ-aminopropyltriethoxysilane, and γ-glycidoxypropyltrimethoxysilane; heterocyclic compounds such as benzotriazole, benzimidazole, indazole, imidazole, 2-mercaptobenzimidazole, 2-mercaptobenzothiazole, 2-mercaptobenzoxazole, urazole, thiouracil, mercaptoimidazole, and mercaptopyrimidine; and urea such as 1,1-dimethyl urea or 1,3-dimethyl urea or thiourea compounds. These adhesion assistants are usually incorporated in a ratio of less than 5% by mass, and preferably less than 2% by mass, with respect to the total solid content of the resist underlayer film-forming composition.

A solid content of the resist underlayer film-forming composition according to the present invention is usually within the range of 0.1 to 70% by mass and preferably 0.1 to 60% by mass. The solid content is a content ratio of all components excluding the solvent from the resist underlayer film-forming composition. The ratio of the polymer in the solid content is preferably within the range of 1 to 100% by mass, 1 to 99.9% by mass, 50 to 99.9% by mass, 50 to 95% by mass, and 50 to 90% by mass, with increasing preference.

One of the measures for evaluating whether the resist underlayer film-forming composition is in a uniform solution state is to observe the passing property through a specific microfilter, and the resist underlayer film-forming composition according to the present invention can pass through a microfilter having a pore size of 0.1 μm and exhibits a uniform solution state.

Examples of a material of the microfilter include fluorine-based resins such as polytetrafluoroethylene (PTFE) and a tetrafluoroethylene-perfluoroalkyl vinyl ether copolymer (PFA), polyethylene (PE), ultra high molecular weight polyethylene (UPE), polypropylene (PP), polysulfone (PSF), polyether sulfone (PES), and nylon, and a microfilter of polytetrafluoroethylene (PTFE) is preferred.

[Resist Underlayer Film]

A resist underlayer film may be formed as follows using the resist underlayer film-forming composition according to the present invention.

A resist underlayer film is formed by applying the resist underlayer film-forming composition of the present invention onto a substrate (for example, a silicon wafer substrate, a silicon/silicon dioxide coated substrate, a silicon nitride substrate, a glass substrate, an ITO substrate, a polyimide substrate, a low dielectric constant material (low-k material) coated substrate, or the like) used for manufacturing of a semiconductor device, and then baking the resist underlayer film-forming composition using a heating means such as a hot plate. The baking conditions are appropriately selected from a baking temperature of 80° C. to 600° C. and a baking time of 0.3 to 60 minutes. Preferably, the baking temperature is 150° C. to 350° C. and the baking time is 0.5 to 2 minutes. As the atmospheric gas during baking, air may be used, and an inert gas such as nitrogen or argon may also be used. The baking may be performed by changing the temperature and the baking time in the first stage and the second stage, respectively. Here, the thickness of the underlayer film to be formed is, for example, within the range of 10 to 1,000 nm, 20 to 500 nm, 30 to 400 nm, or 50 to 300 nm. In addition, when a quartz substrate is used as a substrate, a replica (mold replica) of a quartz imprint mold may be manufactured.

In addition, an adhesive layer and/or a silicone layer containing 99% by mass or less or 50% by mass or less of Si may be formed on the resist underlayer film according to the present invention by coating or vapor deposition. For example, a Si-based inorganic material film may be formed by a CVD method or the like in addition to a method of forming an adhesive layer described in JP 2013-202982 A or JP 5827180 B2 and a silicon-containing resist underlayer film (inorganic resist underlayer film) forming composition by spin coating described in WO 2009/104552 A1.

In addition, the resist underlayer film-forming composition according to the present invention is applied onto a semiconductor substrate (the so-called stepped substrate) having a portion having a step and a position having no step and the substrate is baked, such that a resist underlayer film in which the step between the portion having a step and the portion having no step is in a range of 3 to 70 nm may be formed.

[Method of Manufacturing Semiconductor Device]

A method of manufacturing a semiconductor device according to the present invention includes:

forming a resist underlayer film using the resist underlayer film-forming composition according to the present invention;

forming a resist film on the formed resist underlayer film;

forming a resist pattern by irradiating the formed resist film with a light or electron beam and developing the resist film;

etching and patterning the resist underlayer film through the formed resist pattern; and processing a semiconductor substrate through the patterned resist underlayer film.

In addition, a method of manufacturing a semiconductor device according to the present invention includes:

forming a resist underlayer film using the resist underlayer film-forming composition according to the present invention;

forming a hard mask on the formed resist underlayer film;

forming a resist film on the formed hard mask;

forming a resist pattern by irradiating the formed resist film with a light or electron beam and developing the resist film;

etching and patterning the hard mask through the formed resist pattern;

etching and patterning the resist underlayer film through the patterned hard mask; and processing a semiconductor substrate through the patterned resist underlayer film.

The forming of the resist underlayer film using the resist underlayer film-forming composition according to the present invention is as described above.

An organopolysiloxane film may be formed as a second resist underlayer film on the resist underlayer film formed in the above step, and a resist pattern may be formed thereon. The second resist underlayer film may be a SiON film or a SiN film formed by a vapor deposition method such as CVD or PVD. Furthermore, an anti-reflective film (BARC) may be formed on the second resist underlayer film as a third resist underlayer film, and the third resist underlayer film may be a resist shape correction film having no anti-reflection ability.

In the forming of the resist pattern, exposure is performed through a mask (reticle) for forming a predetermined pattern or by direct drawing. As an exposure light source, for example, a g-ray, an i-ray, a KrF excimer laser, an ArF excimer laser, EUV, or an electron beam may be used. After the exposure, post exposure bake may be performed, if necessary. Thereafter, development is performed with a developer (for example, 2.38% by mass of an aqueous tetramethylammonium hydroxide solution), and rinsing is further performed with a rinse solution or pure water to remove the used developer. Thereafter, post-baking is performed to dry the resist pattern and enhance adhesion to the base.

The etching performed after the forming of the resist pattern is performed by dry etching. Examples of an etching gas used in the dry etching include $CHF_3$, $CF_4$, and $C_2F_6$ for the second resist underlayer film (organopolysiloxane film), include $O_2$, $N_2O$, and $NO_2$ for the first resist underlayer film formed using the resist underlayer film-forming composition of the present invention, and include $CHF_3$, $CF_4$, and $C_2F_6$ for a surface having a step or a concave portion and/or a convex portion. Furthermore, argon, nitrogen, or carbon dioxide may be mixed with these gases and used.

[Forming Resist Underlayer Film by Nanoimprint Method]

The forming of the resist underlayer film may be performed by a nanoimprint method. The method includes:

applying a curable composition onto the formed resist underlayer film;

bringing the curable composition into contact with a mold;

irradiating the curable composition with a light or electron beam to form a cured film; and separating the cured film and the mold from each other.

In a releasing step of an optical nanoimprint technology, adhesion between the resist composition and the substrate is important. This is because in a case where the adhesion between the resist composition and the substrate is low, when the mold is separated in the releasing step, there may be occurred a pattern peeling defect in which a part of a photocured product obtained by curing the resist composition is peeled off while adhering to the mold. As a technology for improving the adhesion between the resist composition and the substrate, a technology for forming an adhesive layer that is a layer for adhesion of the resist composition to the substrate between the resist composition and the substrate has been proposed.

In addition, a high etching resistant layer may be used for forming a pattern in nanoimprinting. As a material of the high etching resistant layer, an organic-based material and a silicone-based material are generally used. Furthermore, an adhesive layer or a silicone layer containing Si may be formed on the resist underlayer film for nanoimprint by coating or vapor deposition. In a case where the adhesive layer or the silicone layer containing Si is hydrophobic and has a high pure water contact angle, it is expected that the underlayer film is also hydrophobic and has a high pure water contact angle, adhesion between the films is enhanced, and peeling is less likely to occur. On the contrary, in a case where the adhesive layer or the silicone layer is hydrophilic and has a low pure water contact angle, it is expected that the underlayer film is also hydrophilic and has a low pure water contact angle, the adhesion between the films is enhanced, and peeling is unlikely to occur.

In addition, He, $H_2$, $N_2$, air, or the like may be used according to the properties of the adhesive film, the silicone layer, and the underlayer film.

The polymer (X) according to the present invention has a desired pure water contact angle not only during low-temperature baking but also during high-temperature baking, and also has a desired pure water contact angle when a crosslinking agent, an acid catalyst, and a surfactant are mixed to form a material. Therefore, it is possible to enhance adhesion to an upper layer film, and it can be expected that permeability to gases such as He, $H_2$, $N_2$, and air is exhibited. Furthermore, the polymer (X) according to the present invention exhibits excellent flatness, and can be adjusted to an optical constant or an etching rate suitable for the process by changing a molecular skeleton.

(Curable Composition)

The photoresist formed on the resist underlayer film is not particularly limited as long as it is sensitive to the light used for exposure. Either a negative photoresist or a positive photoresist may be used. Examples of the photoresist include a positive photoresist consisting of a novolac resin and 1,2-naphthoquinonediazide sulfonic acid ester, a chemically amplified photoresist formed of a binder having a group degradable by an acid to increase an alkali dissolution rate and a photoacid generator, a chemically amplified photoresist formed of a low-molecular-weight compound degradable by an acid to increase an alkali dissolution rate of the photoresist, an alkali-soluble binder, and a photoacid generator, and a chemically amplified photoresist formed of a binder having a group degradable by an acid to increase an alkali dissolution rate, a low-molecular-weight compound degradable by an acid to increase an alkali dissolution rate of the photoresist, and a photoacid generator. Examples thereof include APEX-E (trade name) manufactured by Shipley Company L.L.C, PAR710 (trade name) manufactured by Sumitomo Chemical Co., Ltd., and SEPR430 (trade name) manufactured by Shin-Etsu Chemical Co., Ltd. In addition, examples thereof include a fluorine-containing atomic polymer-based photoresist as described in Proc. SPIE, Vol. 3999, 330-334 (2000), Proc. SPIE, Vol. 3999, 357-364 (2000), and Proc. SPIE, Vol. 3999, 365-374 (2000).

(Applying Curable Composition)

The present step is applying a curable composition onto the resist underlayer film formed by a method of manufacturing a resist underlayer film according to the present invention. As a method of applying the curable composition, for example, an inkjet method, a dip coating method, an air knife coating method, a curtain coating method, a wire bar coating method, a gravure coating method, an extrusion coating method, a spin coating method, a slit scanning method, or the like may be used. An inkjet method is suitable for applying the curable composition as droplets, and a spin coating method is suitable for applying the curable composition. In the present step, an adhesive layer and/or a silicone layer containing 99% by mass or less or 50% by mass or less of Si may be formed on the resist underlayer film by application or vapor deposition, and the curable composition may be applied thereon.

(Bringing Curable Composition into Contact with Mold)

In the present step, the curable composition is brought into contact with the mold. For example, when the curable composition that is a liquid is brought into contact with a mold having a base pattern for transferring a pattern shape, a liquid film in which a concave portion of a fine pattern formed on a surface of the mold is filled with the curable composition is formed.

It is recommended to use a mold using a light transparent material as a substrate in consideration of irradiation with a light or electron beam mentioned below. Specifically, the mold substrate is preferably glass, quartz, PMMA, a light transparent resin such as a polycarbonate resin, a transparent metal deposited film, a flexible film such as polydimethylsiloxane, a photocurable film, a metal film, or the like. The mold substrate is more preferably quartz, because it has a small expansion coefficient and small pattern distortion.

The fine pattern formed on the surface of the mold preferably has a pattern height of 4 nm or more and 200 nm or less. Although a certain pattern height is required to increase the processing accuracy of the substrate, as the pattern height is lower, a force to peel off the mold from the cured film is lower in the separating step to be described below of the cured film and the mold, and the resist pattern is torn off and the number of defects remaining on the mask side is thus reduced. In consideration of these factors, it is recommended to select and adopt an appropriately balanced pattern height.

In addition, adjacent resist patterns may come into contact with each other due to elastic deformation of the resist patterns due to impact when the mold is peeled off, and the resist patterns may be adhered or damaged. This can be avoided by setting the pattern height to about two times or less the pattern width (aspect ratio of 2 or less).

In order to improve peeling properties between the curable composition and the surface of the mold, the mold may be subjected to a surface treatment in advance. An example of a method of the surface treatment includes a method of applying a release agent to the surface of the mold to form a release agent layer. Examples of the release agent include a silicone-based release agent, a fluorine-based release agent, a hydrocarbon-based release agent, a polyethylene-based release agent, a polypropylene-based release agent, a paraffin-based release agent, a montan-based release agent, and a carnuba-based release agent. The release agent is preferably a fluorine-based release agent or a hydrocarbon-based release agent. An example of a commercially available product includes OPTOOL (registered trademark) DSX manufactured by Daikin Industries, Ltd. The release agents may be used each alone or in combination of two or more thereof.

In the present step, a pressure applied to the curable composition when the curable composition is brought into contact with the mold is not particularly limited. A pressure of 0 MPa or more and 100 MPa or less is recommended. The pressure is preferably 0 MPa or more and 50 MPa or less, 30 MPa or less, or 20 MPa or less.

In a case where pre-spread of droplets of the curable composition proceeds in the pre-step (the applying of the curable composition), the spread of the curable composition in the present step is quickly completed. As a result, the time for bringing the curable composition into contact with the mold can be shortened. The contact time is not particularly limited, and is preferably 0.1 seconds or longer and 600 seconds or shorter, 3 seconds or shorter, or 1 second or shorter. When the contact time is too short, spread and filling are insufficient, and a defect called an unfilled defect may occur.

The present step may be performed under any conditions of the air, a reduced pressure atmosphere, and an inert gas atmosphere, and is preferably performed under a pressure of 0.0001 atm or more and 10 atm or less. In order to prevent the influence of oxygen or moisture on the curing reaction, it is recommended to perform the treatment under a reduced pressure atmosphere or an inert gas atmosphere. Specific examples of the inert gas that may be used to form an inert gas atmosphere include nitrogen, carbon dioxide, helium, argon, CFC, HCFC, HFC, and a mixed gas thereof.

The present step may be performed under an atmosphere containing a condensable gas (hereinafter, referred to as a "condensable gas atmosphere"). In the present specification, the condensable gas refers to gas that condenses and liquefies by capillary pressure generated at the time of filling when the curable composition is filled together with the curable composition in the concave portion of the fine pattern formed on the mold and a gap between the mold and the substrate. Note that the condensable gas is present as gas in the atmosphere before the curable composition is brought into contact with the mold in the present step. When the present step is performed under a condensable gas atmosphere, the gas filled in the concave portion of the fine pattern is liquefied by the capillary pressure generated by the curable composition, such that air bubbles are eliminated, and thus, the filling properties are excellent. The condensable gas may be dissolved in the curable composition.

A boiling point of the condensable gas is not limited as long as it is equal to or lower than the atmospheric temperature in the present step, and is preferably −10° C. or higher or +10° C. or higher and +23° C. or lower.

The vapor pressure of the condensable gas at the atmospheric temperature in the present step is not particularly limited as long as it is equal to or lower than the mold pressure. The vapor pressure of the condensable gas is preferably within a range of 0.1 MPa to 0.4 MPa.

Specific examples of the condensable gas include chlorofluorocarbon (CFC) such as trichlorofluoromethane, hydrofluorocarbon (HFC) such as fluorocarbon (FC), hydrochlorofluorocarbon (HCFC), or 1,1,1,3,3-pentafluoropropane ($CHF_2CH_2CF_3$, HFC-245fa, or PFP), and hydrofluoroether (HFE) such as pentafluoroethyl methyl ether ($CF_3CF_2OCH_3$ or HFE-245mc).

The condensable gases may be used each alone or as a mixture of two or more thereof. In addition, these condensable gases may be used by being mixed with a non-condensable gas such as air, nitrogen, carbon dioxide, helium, or argon. The non-condensable gas mixed with the condensable gas is preferably air or helium.

(Irradiating Curable Composition with Light or Electron Beam to Form Cured Film)

In the present step, the curable composition is irradiated with a light or electron beam to form a cured film. That is, the curable composition filled in the fine pattern of the mold is irradiated with a light or electron beam through the mold, and the curable composition filled in the fine pattern of the mold is cured as it is to form a cured film having a pattern shape.

The light or electron beam is selected according to the sensitive wavelength of the curable composition. Specifically, ultraviolet light having a wavelength of 150 nm or more and 400 nm or less, an X-ray, an electron beam, and the like may be appropriately selected and used. Examples of a light source of the light or electron beam include a high-pressure mercury lamp, an ultra-high-pressure mercury lamp, a low-pressure mercury lamp, a deep-UV lamp, a carbon arc lamp, a chemical lamp, a metal halide lamp, a xenon lamp, a KrF excimer laser, an ArF excimer laser, and an F2 excimer laser. The number of light sources may be one or more. The irradiation may be performed on the entire curable composition filled in the fine pattern of the mold, and may be performed on a partial region. The irradiation with light may be intermittently performed on the entire region on the substrate a plurality of times, or may be continuously performed on the entire region. In addition, the first irradiation may be performed on a partial region on the substrate, and the second irradiation may be performed on the region different from the partial region.

The cured film obtained as described above preferably has a pattern having a size of 1 nm or more or 10 nm or more and 10 mm or less or 100 μm or less.

(Separating Cured Film and Mold)

In the present step, the cured film and the mold are separated. The cured film having a pattern shape and the mold are separated, and a cured film having a pattern shape that is an inverted pattern of the fine pattern formed on the mold is obtained in a self-standing state.

A method of separating the cured film having a pattern shape and the mold is not particularly limited as long as the method is a means for moving the cured film and the mold in a direction in which the cured film and the mold are relatively separated and a part of the cured film having a pattern shape is not physically damaged, and various conditions and the like are also not particularly limited. For example, the substrate may be fixed and the mold may be moved away from the substrate to be peeled off, or the mold may be fixed and the substrate may be moved away from the mold to be peeled off. Alternatively, the substrate and the mold may be pulled and moved in opposite directions to be peeled off.

Note that in a case where the bringing of the curable composition into contact with the mold is performed under a condensable gas atmosphere, when the cured film and the mold are separated in the present step, the condensable gas vaporizes as the pressure at the interface at which the cured film and the mold come into contact with each other is decreased. Therefore, it is possible to reduce a release force that is a force required to separate the cured film and the mold.

By the above steps, a cured film having a desired irregularity pattern shape derived from the convex and concave shape of the mold at a desired position may be produced.

EXAMPLES

HPLC purity shown in the following Synthesis Examples in the present specification is the result of measurement by high-performance liquid chromatography (hereinafter, abbreviated as HPLC in the present specification). For the measurement, an HPLC apparatus (LC-2010A HT) manufactured by Shimadzu Corporation was used, and the measurement conditions and the like were as follows.

HPLC column: Inertsil ODS-3 (5 μm, 4.6×250 mm, manufactured by GL Sciences Inc.)

Column temperature: 40° C.

Flow rate: 1.0 mL/min

Solvent: acetonitrile/0.2% aqueous phosphoric acid solution=70/30 (0 to 5 min.)→70/30 (10 to 15 min.)

A weight average molecular weight shown in the following Synthesis Examples of the present specification is a result of measurement by gel permeation chromatography (hereinafter, abbreviated as GPC in the present specification). For the measurement, a GPC apparatus (HLC-8320GPC) manufactured by Tosoh Corporation is used, and the measurement conditions and the like are as follows.

GPC column: TSKgel SuperH-RC, TSKgel Super Multipore HZ-N, TSKgel Super Multipore HZ-N (manufactured by Tosoh Corporation)

Column temperature: 40° C.

Solvent, tetrahydrofuran (for high-performance liquid chromatography, KANTO CHEMICAL CO., INC.)

Standard sample: polystyrene (manufactured by Shodex)

<Synthesis Example 1> Synthesis of Monomer (A) (TM-BP)

100.00 g (0.54 mmol) of 4,4'-biphenol (Tokyo Chemical Industry Co., Ltd.) and 260.00 g of a 17% aqueous sodium hydroxide solution (KANTO CHEMICAL CO., INC.) were charged into a four-necked flask equipped with a stirrer and a cooling tube, and the temperature was raised to 40° C. while stirring. 170.00 g (2.09 mmol) of a 37% aqueous formaldehyde solution (KANTO CHEMICAL CO., INC.) was added dropwise at 40° C., and stirring was performed at the same temperature for 17.5 hours. The reaction mixture was cooled to 10° C. or lower, and then 237.00 g of 17% hydrochloric acid was added dropwise thereto. The resulting precipitate was filtered, and the filtrate was sequentially washed twice with 200 g of pure water. The resulting crystals were put into 200 g of tetrahydrofuran (KANTO CHEMICAL CO., INC., special grade), stirring was performed for 1 hour, the crystals were filtered, and then, the filtrate was washed twice with 50 g of tetrahydrofuran. The resulting crystals were dried at 40° C. under reduced pressure to obtain a monomer (A) at a yield of 27.8%. The purity measured by HPLC was 99.1%.

[Chem. 13]

(A)

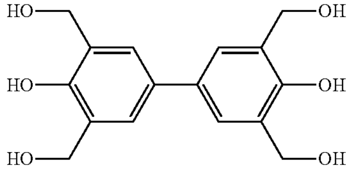

<Synthesis Example 2> Synthesis of Monomer (B) (HM-THPE)

30.00 g (98 mmol) of 1,1,1-tris(4-hydroxyphenyl)ethane (Tokyo Chemical Industry Co., Ltd.) and 115.20 g of a 17% aqueous sodium hydroxide solution (KANTO CHEMICAL CO., INC.) were charged into a four-necked flask equipped with a stirrer and a cooling tube, and the temperature was raised to 40° C. while stirring. 48.08 g (592 mmol) of a 37% aqueous formaldehyde solution (KANTO CHEMICAL CO., INC.) was added dropwise at 40° C., and stirring was performed at the same temperature for 20 hours. 450 g of ethyl acetate (KANTO CHEMICAL CO., INC.) was added to the reaction mixture, the mixture was cooled to 10° C. or lower, and then 105.01 g of 17% hydrochloric acid was added dropwise. An organic layer was separated, the organic layer was sequentially washed twice with 120 g of pure water, once with 120 g of saturated sodium hydrogen carbonate, and twice with 120 g of pure water, and then the resulting organic layer was concentrated at 40° C. under reduced pressure, thereby obtaining a monomer (B) at a yield of 72.9%. The purity measured by GPC was 75.8%.

[Chem. 14]

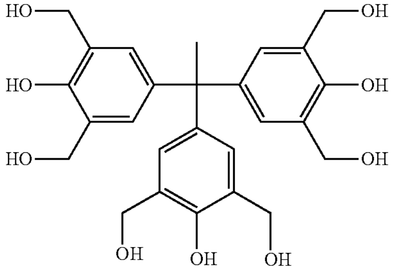

(B)

<Synthesis Example 3> Synthesis of Monomer (C) (HM-THPEI)

10.00 g (23.6 mmol) of α,α,α'-tris(4-hydroxyphenyl)-1-ethyl-4-isopropylbenzene (Tokyo Chemical Industry Co., Ltd.), 4.74 g of an aqueous sodium hydroxide solution (KANTO CHEMICAL CO., INC.), and 40.00 g of pure water were charged into a four-necked flask equipped with a stirrer and a cooling tube, and the temperature was raised to 40° C. while stirring. 11.57 g (143 mmol) of a 37% aqueous formaldehyde solution (KANTO CHEMICAL CO., INC.) was added dropwise at 40° C., and stirring was performed at the same temperature for 27 hours. 160 g of 4-methyl-2-pentanone (KANTO CHEMICAL CO., INC.) was added to the reaction mixture, the mixture was cooled to 10° C. or lower, and then 25.00 g of 6 N hydrochloric acid (KANTO CHEMICAL CO., INC.) was added dropwise. An organic layer was separated, the organic layer was sequentially washed twice with 40 g of pure water, once with 40 g of saturated sodium hydrogen carbonate, and twice with 40 g of pure water, and then the resulting organic layer was concentrated at 40° C. under reduced pressure, thereby obtaining a monomer (C) at a yield of 95.5%. The purity measured by GPC was 70.7%.

[Chem. 15]

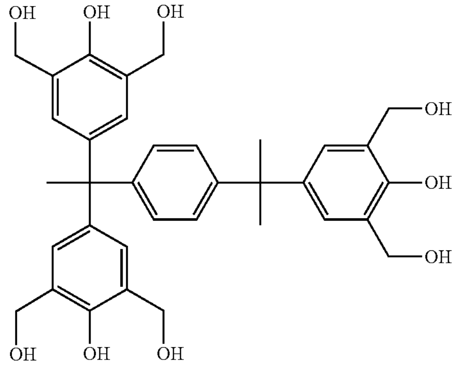

(C)

<Synthesis Example 4> Synthesis of Monomer (D) (HM-THPM)

10.00 g (34.2 mmol) of tris(4-hydroxyphenyl)methane (Tokyo Chemical Industry Co., Ltd.), 6.88 g (171 mmol) of sodium hydroxide (KANTO CHEMICAL CO., INC.), and 40.00 g of pure water were charged into a four-necked flask equipped with a stirrer and a cooling tube, and the temperature was raised to 40° C. while stirring. 16.8 g (207 mmol) of a 37% aqueous formaldehyde solution (KANTO CHEMICAL CO., INC.) was added dropwise at 40° C., and stirring was performed at the same temperature for 16 hours. 160 g of 4-methyl-2-pentanone (KANTO CHEMICAL CO., INC.) was added to the reaction mixture, the mixture was cooled to 10° C. or lower, and then 25 g of 20% hydrochloric acid was added dropwise. An organic layer was separated, the organic layer was sequentially washed twice with 40 g of pure water, once with 40 g of saturated sodium hydrogen carbonate, and twice with 40 g of pure water, and then the resulting organic layer was concentrated at 40° C. under reduced pressure, thereby obtaining a monomer (D) at a yield of 77.3%. The purity measured by GPC was 90.6%.

[Chem. 16]

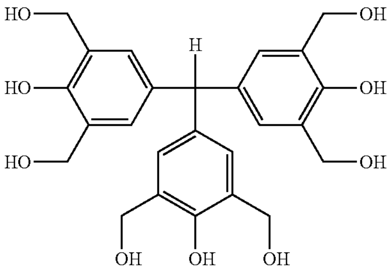

(D)

<Synthesis Example 5> Synthesis of Monomer (E) (TM-DHPPE)

10.00 g (34.4 mmol) of 1,1-bis(4-hydroxyphenyl)-1-phenylethane (Tokyo Chemical Industry Co., Ltd.), 4.15 g (103 mmol) of sodium hydroxide (KANTO CHEMICAL CO., INC.), and 40.00 g of pure water were charged into a four-necked flask equipped with a stirrer and a cooling tube, and the temperature was raised to 40° C. while stirring. 11.32 g (140 mmol) of a 37% aqueous formaldehyde solution (KANTO CHEMICAL CO., INC.) was added dropwise at 40° C., and stirring was performed at the same temperature for 20 hours. 160 g of 4-methyl-2-pentanone (KANTO CHEMICAL CO., INC.) was added to the reaction mixture, the mixture was cooled to 10° C. or lower, and then 25 g of 20% hydrochloric acid was added dropwise. An organic layer was separated, the organic layer was sequentially washed twice with 40 g of pure water, once with 40 g of saturated sodium hydrogen carbonate, and twice with 40 g of pure water, and then the resulting organic layer was concentrated at 40° C. under reduced pressure, thereby obtaining a monomer (E) at a yield of 73.8%. The purity measured by GPC was 91.9%.

[Chem. 17]

(E)

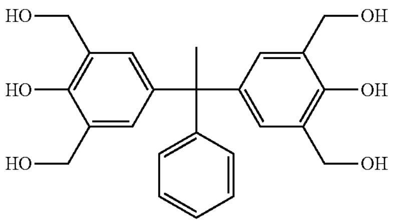

<Synthesis Example 6> Synthesis of Polymer (01) (Poly-TM-BP)

Into a four-necked flask equipped with a stirrer and a cooling tube, a solution of 8.00 g (26.12 mmol) of the monomer (A) obtained in Synthesis Example 1, 40.79 g of propylene glycol monomethyl ether, and 0.013 g (0.13 mmol) of methanesulfonic acid (Tokyo Chemical Industry Co., Ltd.) dissolved in 4.53 g of propylene glycol monomethyl ether was charged, the temperature was raised to 85° C. under nitrogen, and stirring was performed at 85° C. for 64 hours. The temperature was lowered to 30° C. or lower, and then the resulting reaction mixture was added dropwise to 450 mL of a methanol (KANTO CHEMICAL CO., INC., special grade)/water (6/4) mixed solvent to precipitate the polymer. The resulting precipitate was filtered, the filtrate was washed three times separately with 110 mL of methanol/water (6/4), and vacuum drying was performed, thereby obtaining the polymer. The weight average molecular weight (Mw) measured in terms of standard polystyrene by GPC was 2,267, and the yield was 69.8%. The polymer had a repeating unit structure represented by the following Formula (01). The resulting polymer was diluted with propylene glycol monomethyl ether acetate to a solid content concentration of 30%. Thereto were added a cation exchange resin and an anion exchange resin in the same amounts as the solid content, and stirring was performed for 4 hours. The ion exchange resin was filtered to obtain a polymer (01) solution.

[Chem. 18]

(01)

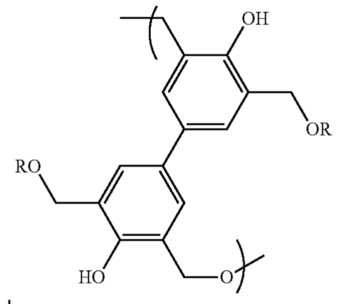

R = H, 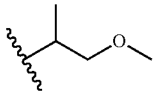

<Synthesis Example 7> Synthesis of Polymer (02) (Poly-HM-THPE)

Into a four-necked flask equipped with a stirrer and a cooling tube, a solution of 25.00 g (51.39 mmol) of the monomer (B) obtained in Synthesis Example 2, 95.00 g of propylene glycol monomethyl ether, and 0.049 g (0.51 mmol) of methanesulfonic acid (Tokyo Chemical Industry Co., Ltd.) dissolved in 5.00 g of propylene glycol monomethyl ether was charged, the temperature was raised to 85° C. under nitrogen, and stirring was performed at 85° C. for 23 hours. The temperature was lowered to 30° C. or lower, and then the resulting reaction mixture was added dropwise to 1,100 mL of a methanol (KANTO CHEMICAL CO., INC., special grade)/water (5/5) mixed solvent to precipitate the polymer. The resulting precipitate was filtered, the filtrate was washed three times separately with 110 mL of methanol/water (5/5), and vacuum drying was performed, thereby obtaining the polymer. The weight average molecular weight (Mw) measured in terms of standard polystyrene by GPC was 4,590, and the yield was 90.5%. The polymer had a repeating unit structure represented by the following Formula (02). The resulting polymer was diluted with propylene glycol monomethyl ether acetate to a solid content concentration of 30%. Thereto were added a cation exchange resin and an anion exchange resin in the same amounts as the solid content, and stirring was performed for 4 hours. The ion exchange resin was filtered to obtain a polymer (02) solution.

[Chem. 19]

(02)

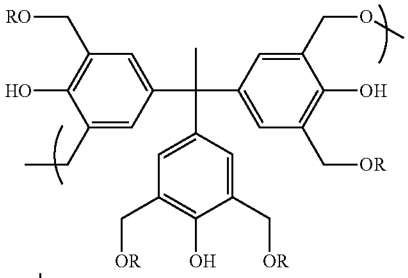

R = H, 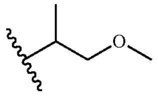

<Synthesis Example 8> Synthesis of Polymer (03) (Poly-HM-THPEI)

Into a four-necked flask equipped with a stirrer and a cooling tube, a solution of 6.00 g (9.92 mmol) of the monomer (C) obtained in Synthesis Example 3, 40.79 g of propylene glycol monomethyl ether, and 0.010 g (0.10 mmol) of methanesulfonic acid (Tokyo Chemical Industry Co., Ltd.) dissolved in 3.4 g of propylene glycol monomethyl ether was charged, the temperature was raised to 85° C. under nitrogen, and stirring was performed at 85° C. for 49.5 hours. The temperature was lowered to 30° C. or lower, and then the resulting reaction mixture was added dropwise to 360 mL of a methanol (KANTO CHEMICAL CO., INC., special grade)/water (5/5) mixed solvent to precipitate the polymer. The resulting precipitate was filtered, the filtrate was washed three times separately with 90 mL of methanol/water (5/5), and vacuum drying was performed, thereby obtaining the polymer. The weight average molecular weight (Mw) measured in terms of standard polystyrene by GPC was 4,595, and the yield was 72.3%. The polymer had a repeating unit structure represented by the following Formula (03). The resulting polymer was diluted with propylene glycol monomethyl ether acetate to a solid content concentration of 30%. Thereto were added a cation exchange resin and an anion exchange resin in the same amounts as the solid content, and stirring was performed for 4 hours. The ion exchange resin was filtered to obtain a polymer (03) solution.

[Chem. 20]

(03)

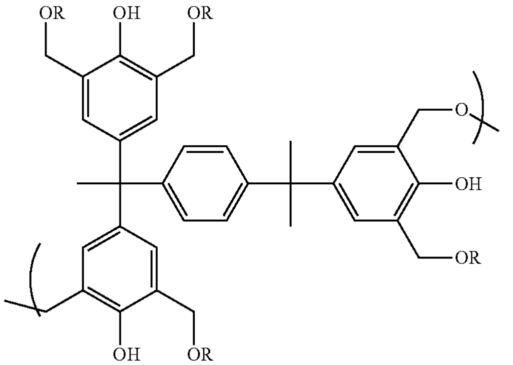

R = H, 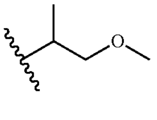

<Synthesis Example 9> Synthesis of Polymer (04) (Poly-HM-THPM)

Into a four-necked flask equipped with a stirrer and a cooling tube, a solution of 10.00 g (21.16 mmol) of the monomer (D) obtained in Synthesis Example 4, 36.00 g of propylene glycol monomethyl ether, and 0.012 g (0.11 mmol) of methanesulfonic acid (Tokyo Chemical Industry Co., Ltd.) dissolved in 4.00 g of propylene glycol monomethyl ether was charged, the temperature was raised to 85° C. under nitrogen, and stirring was performed at 85° C. for 23 hours. The temperature was lowered to 30° C. or lower, and then the resulting reaction mixture was added dropwise to 450 mL of a methanol (KANTO CHEMICAL CO., INC., special grade)/water (3/7) mixed solvent to precipitate the polymer. The resulting precipitate was filtered, the filtrate was washed three times separately with 120 mL of methanol/water (3/7), and vacuum drying was performed, thereby obtaining the polymer. The weight average molecular weight (Mw) measured in terms of standard polystyrene by GPC was 2,184, and the yield was 64.8%. The polymer had a repeating unit structure represented by the following Formula (04). The resulting polymer was diluted with propylene glycol monomethyl ether acetate to a solid content concentration of 30%. Thereto were added a cation exchange resin and an anion exchange resin in the same amounts as the solid content, and stirring was performed for 4 hours. The ion exchange resin was filtered to obtain a polymer (04) solution.

[Chem. 21]

(04)

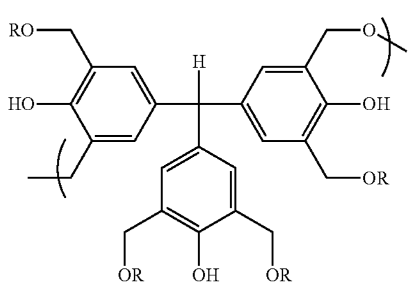

R = H, 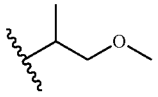

<Synthesis Example 10> Synthesis of Polymer (05) (Poly-TM-DHPPE)

Into a four-necked flask equipped with a stirrer and a cooling tube, a solution of 9.00 g (21.93 mmol) of the monomer (E) obtained in Synthesis Example 5, 32.00 g of propylene glycol monomethyl ether, and 0.011 g (0.11 mmol) of methanesulfonic acid (Tokyo Chemical Industry Co., Ltd.) dissolved in 3.60 g of propylene glycol monomethyl ether was charged, the temperature was raised to 85° C. under nitrogen, and stirring was performed at 85° C. for 23 hours. The temperature was lowered to 30° C. or lower, 90 mL of ethyl acetate (KANTO CHEMICAL CO., INC., special grade) and 90 mL of water were added to the resulting reaction mixture for liquid separation, and then the organic layer was further washed twice with 40 mL of water. The resulting organic layer was concentrated under reduced pressure at 40° C. to obtain the polymer. The weight average molecular weight Mw measured in terms of standard polystyrene by GPC was 789. The polymer had a repeating unit structure represented by the following Formula (05). The resulting polymer was diluted with propylene glycol monomethyl ether acetate to a solid content concentration of 30%. Thereto were added a cation exchange resin and an anion exchange resin in the same amounts as the solid content, and stirring was performed for 4 hours. The ion exchange resin was filtered to obtain a polymer (05) solution.

[Chem. 22]

(05)

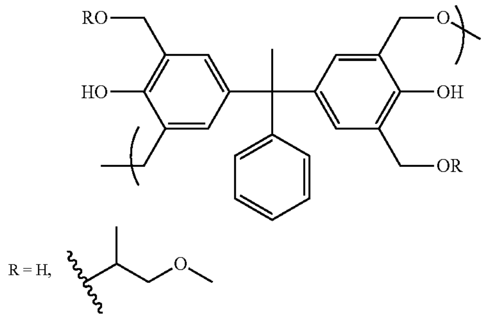

R = H,

<Synthesis Example 11> Synthesis of Polymer (06) (Poly-TM-BIP-A)

Into a four-necked flask equipped with a stirrer and a cooling tube, a solution of 15.00 g (43.05 mmol) of 2,2-bis (4-hydroxy-3,5-dihydroxymethylphenyl)propane (ASAHI YUKIZAI CORPORATION), 76.48 g of propylene glycol monomethyl ether, and 0.021 g (0.22 mmol) of methanesulfonic acid (Tokyo Chemical Industry Co., Ltd.) dissolved in 8.5 g of propylene glycol monomethyl ether was charged, the temperature was raised to 85° C. under nitrogen, and stirring was performed at 85° C. for 16 hours. The temperature was lowered to 30° C. or lower, 220 mL of ethyl acetate (KANTO CHEMICAL CO., INC., special grade) and 100 mL of water were added to the resulting reaction mixture for liquid separation, and then the organic layer was further washed twice with 100 mL of water. The resulting organic layer was concentrated under reduced pressure at 40° C. to obtain the polymer. The weight average molecular weight (Mw) measured in terms of standard polystyrene by GPC was 1,194. This polymer had a repeating unit structure represented by the following Formula (06). The resulting polymer was diluted with propylene glycol monomethyl ether acetate to a solid content concentration of 30%. Thereto were added a cation exchange resin and an anion exchange resin in the same amounts as the solid content, and stirring was performed for 4 hours. The ion exchange resin was filtered to obtain a polymer (06) solution.

[Chem. 23]

(06)

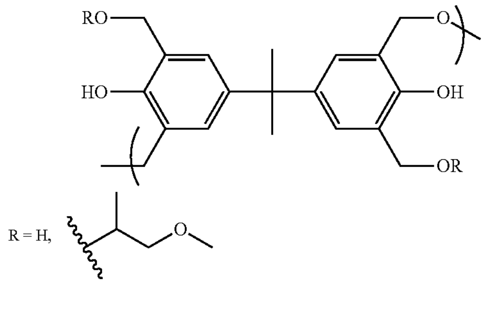

R = H,

<Synthesis Example 12> Synthesis of Polymer (07) (Poly-TM-BIP-BZ)

Into a four-necked flask equipped with a stirrer and a cooling tube, a solution of 10.00 g (25.22 mmol) of TM-BIP-BZ (ASAHI YUKIZAI CORPORATION), 36.00 g of propylene glycol monomethyl ether, and 0.024 g (0.25 mmol) of methanesulfonic acid (Tokyo Chemical Industry Co., Ltd.) dissolved in 4.00 g of propylene glycol monomethyl ether was charged, the temperature was raised to 85° C. under nitrogen, and stirring was performed at 85° C. for 19 hours. The temperature was lowered to 30° C. or lower, and then the resulting reaction mixture was added dropwise to 450 mL of a methanol (KANTO CHEMICAL CO., INC., special grade)/water (5/5) mixed solvent to precipitate the polymer. The resulting precipitate was filtered, the filtrate was washed three times separately with 120 mL of methanol/water (5/5), and vacuum drying was performed, thereby obtaining the polymer. The weight average molecular weight (Mw) measured in terms of standard polystyrene by GPC was 1,432, and the yield was 87.9%. This polymer had a repeating unit structure represented by the following Formula (07). The resulting polymer was diluted with propylene glycol monomethyl ether acetate to a solid content concentration of 30%. Thereto were added a cation exchange resin and an anion exchange resin in the same amounts as the solid content, and stirring was performed for 4 hours. The ion exchange resin was filtered to obtain a polymer (07) solution.

[Chem. 24]

(07)

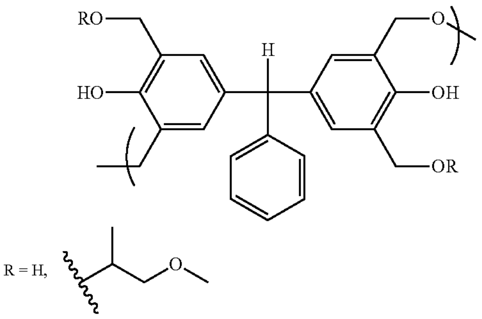

R = H,

<Synthesis Example 13> Synthesis of Polymer (08) (TM-BP/4,4'BP)

Into a four-necked flask equipped with a stirrer and a cooling tube, a solution of 7.00 g (22.85 mmol) of the monomer (A) obtained in Synthesis Example 1, 57.39 g of propylene glycol monomethyl ether, and 0.033 g (0.33 mmol) of methanesulfonic acid (Tokyo Chemical Industry Co., Ltd.) dissolved in 6.38 g of propylene glycol monomethyl ether was charged, the temperature was raised to 85° C. under nitrogen, and stirring was performed at 85° C. for 46 hours. The temperature was lowered to 30° C. or lower, and then the resulting reaction mixture was added dropwise to 680 mL of methanol (KANTO CHEMICAL CO., INC., special grade) to precipitate the polymer. The resulting precipitate was filtered, the filtrate was washed three times separately with 170 mL of methanol, and vacuum drying was performed, thereby obtaining the polymer. The weight average molecular weight (Mw) measured in terms of standard polystyrene by GPC was 1,143, and the yield was 67.9%. This polymer had a repeating unit structure represented by the following Formula (08). The resulting polymer was diluted with propylene glycol monomethyl ether acetate to a solid content concentration of 30%. Thereto were added a cation exchange resin and an anion exchange resin in the same amounts as the solid content, and stirring was performed for 4 hours. The ion exchange resin was filtered to obtain a polymer (08) solution.

[Chem. 25]

(08)

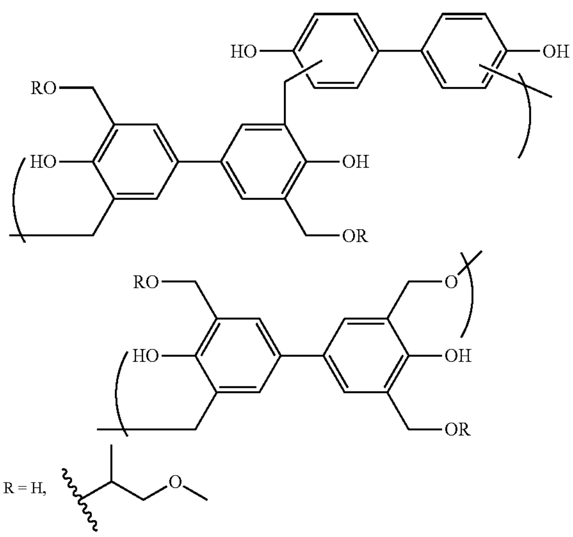

<Synthesis Example 14> Synthesis of Polymer (09) (TM-BP/THPE)

Into a four-necked flask equipped with a stirrer and a cooling tube, a solution of 4.99 g (16.32 mmol) of the monomer (A) obtained in Synthesis Example 1, 5.00 g (16.32 mmol) of 1,1,1-tris(4-hydroxyphenyl)ethane (Tokyo Chemical Industry Co., Ltd.), 50.98 g of propylene glycol monomethyl ether, and 0.016 g (0.16 mmol) of methanesulfonic acid (Tokyo Chemical Industry Co., Ltd.) dissolved in 5.67 g of propylene glycol monomethyl ether was charged, the temperature was raised to 85° C. under nitrogen, and stirring was performed at 85° C. for 47 hours. The temperature was lowered to 30° C. or lower, and then the resulting reaction mixture was added dropwise to 590 mL of a methanol (KANTO CHEMICAL CO., INC., special grade)/water (3/7) mixed solvent to precipitate the polymer. The resulting precipitate was filtered, the filtrate was washed three times separately with 150 mL of methanol/water (3/7), and vacuum drying was performed, thereby obtaining the polymer. The weight average molecular weight (Mw) measured in terms of standard polystyrene by GPC was 1,381, and the yield was 69.9%. This polymer had a repeating unit structure represented by the following Formula (09). The resulting polymer was diluted with propylene glycol monomethyl ether acetate to a solid content concentration of 30%. Thereto were added a cation exchange resin and an anion exchange resin in the same amounts as the solid content, and stirring was performed for 4 hours. The ion exchange resin was filtered to obtain a polymer (09) solution.

[Chem. 26]

(09)

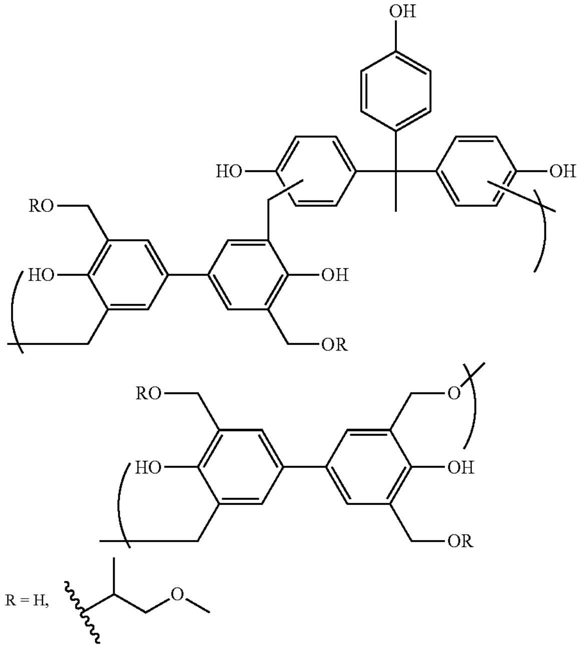

<Synthesis Example 15> Synthesis of Polymer (10) (TM-BP/Cz)

Into a four-necked flask equipped with a stirrer and a cooling tube, a solution of 7.00 g (22.85 mmol) of the monomer (A) obtained in Synthesis Example 1, 3.82 g (22.85 mmol) of carbazole (Tokyo Chemical Industry Co., Ltd.), 55.17 g of propylene glycol monomethyl ether, and 0.022 g (0.23 mmol) of methanesulfonic acid (Tokyo Chemical Industry Co., Ltd.) dissolved in 6.13 g of propylene glycol monomethyl ether was charged, the temperature was raised to 85° C. under nitrogen, and stirring was performed at 85° C. for 4 hours. The temperature was lowered to 30° C. or lower, and then the resulting reaction mixture was added dropwise to 630 mL of methanol (KANTO CHEMICAL CO., INC., special grade) to precipitate the polymer. The resulting precipitate was filtered, the filtrate was washed three times separately with 160 mL of methanol, and vacuum drying was performed, thereby obtaining the polymer. The weight average molecular weight (Mw) measured in terms of standard polystyrene by GPC was 14,916, and the yield was 71.5%. This polymer had a repeating unit structure represented by the following Formula (10). The resulting polymer was diluted with propylene glycol monomethyl ether acetate to a solid content concentration of 30%. Thereto were added a cation exchange resin and an anion exchange resin in the same amounts as the solid content, and stirring was performed for 4 hours. The ion exchange resin was filtered to obtain a polymer (10) solution.

[Chem. 27]

(10)

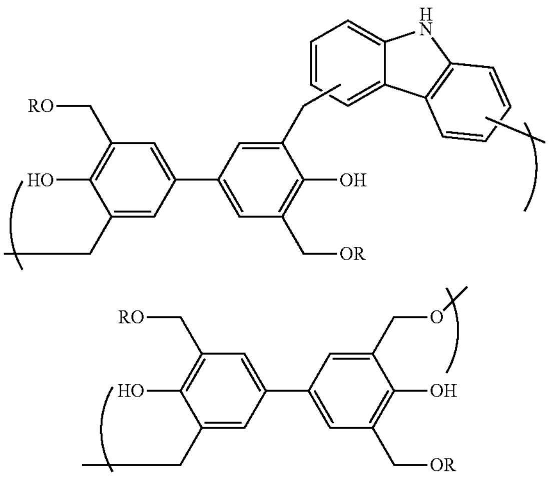

R = H, 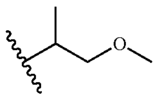

[Chem. 28]

(11)

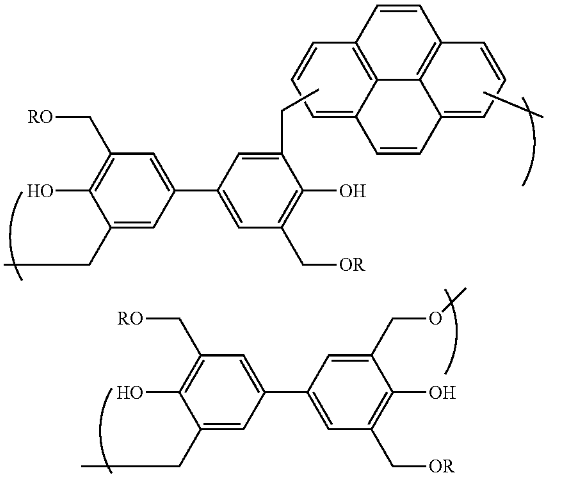

R = H, 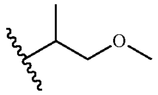

<Synthesis Example 16> Synthesis of Polymer (11) (TM-BP/Pyrene)

Into a four-necked flask equipped with a stirrer and a cooling tube, a solution of 3.00 g (19.79 mmol) of the monomer (A) obtained in Synthesis Example 1, 1.99 g (9.79 mmol) of pyrene (Tokyo Chemical Industry Co., Ltd.), 17.92 g of propylene glycol monomethyl ether, and 0.010 g (0.01 mmol) of methanesulfonic acid (Tokyo Chemical Industry Co., Ltd.) dissolved in 1.99 g of propylene glycol monomethyl ether was charged, the temperature was raised to 85° C. under nitrogen, and stirring was performed at 85° C. for 27 hours. The temperature was lowered to 30° C. or lower, and then the resulting reaction mixture was added dropwise to 270 mL of methanol (KANTO CHEMICAL CO., INC., special grade) to precipitate the polymer. The resulting precipitate was filtered, the filtrate was washed three times separately with 70 mL of methanol, and vacuum drying was performed, thereby obtaining the polymer. The weight average molecular weight (Mw) measured in terms of standard polystyrene by GPC was 4,134, and the yield was 64.5%. This polymer had a repeating unit structure represented by the following Formula (11). The resulting polymer was diluted with propylene glycol monomethyl ether acetate to a solid content concentration of 30%. Thereto were added a cation exchange resin and an anion exchange resin in the same amounts as the solid content, and stirring was performed for 4 hours. The ion exchange resin was filtered to obtain a polymer solution.

<Synthesis Example 17> Synthesis of Polymer (12)

(TM-BP/1-Hydroxypyrene)

Into a four-necked flask equipped with a stirrer and a cooling tube, 25.00 g (81.62 mmol) of the monomer (A) obtained in Synthesis Example 1, 17.81 g (81.62 mmol) of 1-hydroxypyrene (Tokyo Chemical Industry Co., Ltd.), 171.18 g of propylene glycol monomethyl ether, and 0.0784 g (0.82 mmol) of methanesulfonic acid (Tokyo Chemical Industry Co., Ltd.) were charged, the temperature was raised to 85° C. under nitrogen, and stirring was performed at 85° C. for 21 hours. The temperature was lowered to 30° C. or lower, and then the resulting reaction mixture was added dropwise to 2,000 mL of methanol (KANTO CHEMICAL CO., INC., special grade) to precipitate the polymer. The resulting precipitate was filtered, the filtrate was washed three times separately with 5,000 mL of methanol, and vacuum drying was performed, thereby obtaining the polymer. The weight average molecular weight (Mw) measured in terms of standard polystyrene by GPC was 8,645, and the yield was 55.8%. This polymer had a repeating unit structure represented by the following Formula (12). The resulting polymer was diluted with propylene glycol monomethyl ether acetate to a solid content concentration of 30%. Thereto were added a cation exchange resin and an anion exchange resin in the same amounts as the solid content, and stirring was performed for 4 hours. The ion exchange resin was filtered to obtain a polymer solution.

[Chem. 29]

(12)

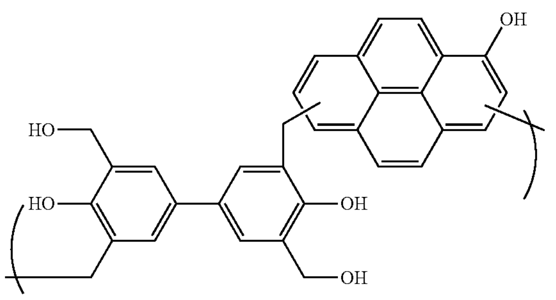

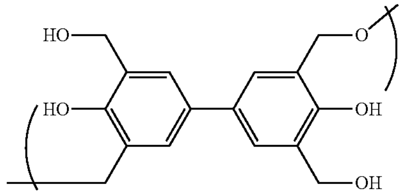

R = H, 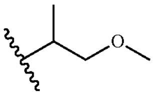

<Comparative Synthesis Example 1> Synthesis of Polymer (13) (Cz/BA)

Into a flask equipped with a stirrer and a cooling tube, 30.00 g (179.4 mmol) of carbazole (manufactured by Tokyo Chemical Industry Co., Ltd.), 19.04 g (179.42 mmol) of benzaldehyde (manufactured by Tokyo Chemical Industry Co., Ltd.), 0.35 g (3.59 mmol) of methanesulfonic acid (manufactured by Tokyo Chemical Industry Co., Ltd.), and 146.77 g of propylene glycol monomethyl ether acetate were charged. Thereafter, the mixture was heated and refluxed under nitrogen, and stirring was performed for 8 hours. The temperature was lowered to 30° C. or lower, and then the resulting reaction mixture was added dropwise to 1,800 mL of methanol (KANTO CHEMICAL CO., INC., special grade) to precipitate the polymer. The resulting precipitate was filtered, the filtrate was washed three times separately with 450 mL of methanol, and vacuum drying was performed, thereby obtaining the polymer. The weight average molecular weight (Mw) measured in terms of standard polystyrene by GPC was 5,795, and the yield was 50.9%. This polymer had a repeating unit structure represented by the following Formula (13). The resulting polymer was diluted with propylene glycol monomethyl ether acetate to a solid content concentration of 30%. Thereto were added a cation exchange resin and an anion exchange resin in the same amounts as the solid content, and stirring was performed for 4 hours. The ion exchange resin was filtered to obtain a polymer (13) solution.

[Chem. 30]

(13)

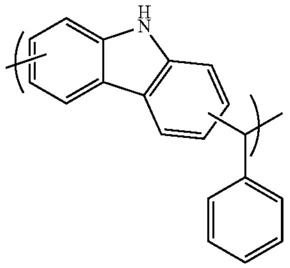

<Comparative Synthesis Example 2> (Synthesis of Polymer (14))

(BT-NA-PCA)

Into a 100 mL-volume two-necked flask, 25.00 g of 2,2'-biphenol (manufactured by Tokyo Chemical Industry Co., Ltd.), 10.5 g of 1-naphthaldehyde (manufactured by Tokyo Chemical Industry Co., Ltd.), 15.5 g of 1-pyrenecarboxaldehyde (manufactured by Sigma-Aldrich), and 3.87 g of methanesulfonic acid (manufactured by Tokyo Chemical Industry Co., Ltd.) were charged under nitrogen. Thereafter, the mixture was heated to 120° C., cooled to room temperature for about 24 hours, then precipitated with methanol, and the resulting precipitate was dried. The weight average molecular weight Mw measured in terms of polystyrene by GPC was 2,000. The resulting polymer was diluted with propylene glycol monomethyl ether acetate to a solid content concentration of 30%. Thereto were added a cation exchange resin and an anion exchange resin in the same amounts as the solid content, and stirring was performed for 4 hours. The ion exchange resin was filtered to obtain a polymer (14) solution.

Example 1

3.47 g of the polymer (01) obtained in Synthesis Example 6 was mixed with 0.09 g of a propylene glycol monomethyl ether acetate solution containing a 1% surfactant (manufactured by DIC Corporation, product name: MEGAFACE [trade name] R-40, fluorine-based surfactant), 2.75 g of propylene glycol monomethyl ether, and 3.70 g of propylene glycol monomethyl ether acetate. Thereafter, the resultant mixture was filtered through a polytetrafluoroethylene microfilter having a pore size of 0.1 μm to prepare a solution of a resist underlayer film-forming composition.

Example 2

3.67 g of the polymer (02) obtained in Synthesis Example 7 was mixed with 0.09 g of a propylene glycol monomethyl ether acetate solution containing a 1% surfactant (manufactured by DIC Corporation, product name: MEGAFACE [trade name] R-40, fluorine-based surfactant), 2.73 g of propylene glycol monomethyl ether, and 3.51 g of propylene glycol monomethyl ether acetate. Thereafter, the resultant mixture was filtered through a polytetrafluoroethylene microfilter having a pore size of 0.1 μm to prepare a solution of a resist underlayer film-forming composition.

Example 3

3.55 g of the polymer (03) obtained in Synthesis Example 8 was mixed with 0.09 g of a propylene glycol monomethyl ether acetate solution containing a 1% surfactant (manufactured by DIC Corporation, product name: MEGAFACE [trade name] R-40, fluorine-based surfactant), 2.75 g of propylene glycol monomethyl ether, and 3.62 g of propylene glycol monomethyl ether acetate. Thereafter, the resultant mixture was filtered through a polytetrafluoroethylene microfilter having a pore size of 0.1 μm to prepare a solution of a resist underlayer film-forming composition.

Example 4

3.86 g of the polymer (04) obtained in Synthesis Example 9 was mixed with 0.09 g of a propylene glycol monomethyl ether acetate solution containing a 1% surfactant (manufactured by DIC Corporation, product name: MEGAFACE [trade name] R-40, fluorine-based surfactant), 2.75 g of propylene glycol monomethyl ether, and 3.31 g of propylene glycol monomethyl ether acetate. Thereafter, the resultant mixture was filtered through a polytetrafluoroethylene microfilter having a pore size of 0.1 μm to prepare a solution of a resist underlayer film-forming composition.

Example 5

4.83 g of the polymer (05) obtained in Synthesis Example 10 was mixed with 0.12 g of a propylene glycol monomethyl ether acetate solution containing a 1% surfactant (manufactured by DIC Corporation, product name: MEGAFACE [trade name] R-40, fluorine-based surfactant), 0.24 g of a propylene glycol monomethyl ether solution containing 5% pyridinium p-toluenesulfonate, 1.81 g of propylene glycol monomethyl ether, and 1.00 g of propylene glycol monomethyl ether acetate. Thereafter, the resultant mixture was filtered through a polytetrafluoroethylene microfilter having a pore size of 0.1 μm to prepare a solution of a resist underlayer film-forming composition.

Example 6

4.37 g of the polymer (06) obtained in Synthesis Example 11 was mixed with 0.15 g of a propylene glycol monomethyl ether acetate solution containing a 1% surfactant (manufactured by DIC Corporation, product name: MEGAFACE [trade name] R-40, fluorine-based surfactant), 0.30 g of a propylene glycol monomethyl ether solution containing 5% pyridinium p-toluenesulfonate, 2.27 g of propylene glycol monomethyl ether, and 2.93 g of propylene glycol monomethyl ether acetate. Thereafter, the resultant mixture was filtered through a polytetrafluoroethylene microfilter having a pore size of 0.1 μm to prepare a solution of a resist underlayer film-forming composition.

Example 7

4.28 g of the polymer (07) obtained in Synthesis Example 12 was mixed with 0.12 g of a propylene glycol monomethyl ether acetate solution containing a 1% surfactant (manufactured by DIC Corporation, product name: MEGAFACE [trade name] R-40, fluorine-based surfactant), 0.24 g of a propylene glycol monomethyl ether solution containing 5% pyridinium p-toluenesulfonate, 2.41 g of propylene glycol monomethyl ether, and 2.97 g of propylene glycol monomethyl ether acetate. Thereafter, the resultant mixture was filtered through a polytetrafluoroethylene microfilter having a pore size of 0.1 μm to prepare a solution of a resist underlayer film-forming composition.

Example 8

4.02 g of the polymer (08) obtained in Synthesis Example 13 was mixed with 0.10 g of a propylene glycol monomethyl ether acetate solution containing a 1% surfactant (manufactured by DIC Corporation, product name: MEGAFACE [trade name] R-40, fluorine-based surfactant), 2.70 g of propylene glycol monomethyl ether, and 3.18 g of propylene glycol monomethyl ether acetate. Thereafter, the resultant mixture was filtered through a polytetrafluoroethylene microfilter having a pore size of 0.1 μm to prepare a solution of a resist underlayer film-forming composition.

Example 9

4.94 g of the polymer (09) obtained in Synthesis Example 14 was mixed with 0.12 g of a propylene glycol monomethyl ether acetate solution containing a 1% surfactant (manufactured by DIC Corporation, product name: MEGAFACE [trade name] R-40, fluorine-based surfactant), 2.64 g of propylene glycol monomethyl ether, and 2.30 g of propylene glycol monomethyl ether acetate. Thereafter, the resultant mixture was filtered through a polytetrafluoroethylene microfilter having a pore size of 0.1 μm to prepare a solution of a resist underlayer film-forming composition.

Example 10

4.00 g of the polymer (10) obtained in Synthesis Example 15 was mixed with 0.10 g of a propylene glycol monomethyl ether acetate solution containing a 1% surfactant (manufactured by DIC Corporation, product name: MEGAFACE [trade name] R-40, fluorine-based surfactant), 2.70 g of propylene glycol monomethyl ether, and 3.20 g of propylene glycol monomethyl ether acetate. Thereafter, the resultant mixture was filtered through a polytetrafluoroethylene microfilter having a pore size of 0.1 μm to prepare a solution of a resist underlayer film-forming composition.

Example 11

4.92 g of the polymer (11) obtained in Synthesis Example 16 was mixed with 0.12 g of a propylene glycol monomethyl ether acetate solution containing a 1% surfactant (manufactured by DIC Corporation, product name: MEGAFACE [trade name] R-40, fluorine-based surfactant), 0.24 g of a propylene glycol monomethyl ether solution containing 5% pyridinium p-toluenesulfonate, 3.01 g of propylene glycol monomethyl ether, 0.47 g of propylene glycol monomethyl ether acetate, and 3.24 g of cyclohexanone. Thereafter, the resultant mixture was filtered through a polytetrafluoroethylene microfilter having a pore size of 0.1 μm to prepare a solution of a resist underlayer film-forming composition.

Example 12

4.50 g of the polymer (12) obtained in Synthesis Example 17 was mixed with 0.13 g of a propylene glycol monomethyl ether acetate solution containing a 1% surfactant (manufactured by DIC Corporation, product name: MEGAFACE [trade name] R-40, fluorine-based surfactant), 6.38 g of propylene glycol monomethyl ether, and 3.99 g of propylene glycol monomethyl ether acetate. Thereafter, the resultant mixture was filtered through a polytetrafluoroethylene microfilter having a pore size of 0.1 μm to prepare a solution of a resist underlayer film-forming composition.

Comparative Example 1

43.91 g of the polymer (13) obtained in Comparative Synthesis Example 1 was mixed with 1.23 g of a propylene glycol monomethyl ether acetate solution containing a 1% surfactant (manufactured by DIC Corporation, product name: MEGAFACE [trade name] R-40, fluorine-based surfactant), 1.23 g of TMOM-BP (manufactured by ASAHI YUKIZAI CORPORATION and Honshu Chemical Industry Co., Ltd., crosslinking agent), 12.25 g of a propylene glycol monomethyl ether solution containing 1% pyridinium p-toluenesulfonate, 28.82 g of propylene glycol monomethyl ether, and 62.68 g of propylene glycol monomethyl ether acetate. Thereafter, the resultant mixture was filtered through a polytetrafluoroethylene microfilter having a pore size of 0.1 μm to prepare a solution of a resist underlayer film-forming composition.

Comparative Example 2

To 3.02 g of the polymer (14) solution (solid content: 29.9% by mass) obtained in Comparative Synthesis Example 2, 0.10 g of propylene glycol monomethyl ether acetate containing 1% by mass of a surfactant (manufactured by DIC Corporation, MEGAFACE R-40), 3.68 g of propylene glycol monomethyl ether acetate, and 2.68 g of propylene glycol monomethyl ether were added and dissolved, and the solution was filtered through a polytetrafluoroethylene microfilter having a pore size of 0.1 μm, thereby preparing a solution of a resist underlayer film-forming composition.

<Film Formation Test in Air>

(Test for Elution into Photoresist Solvent)

Each of the solutions of the resist underlayer film-forming composition prepared in Examples 1 to 12 and Comparative Example 1 was applied onto a silicon wafer using a spin coater. Baking was performed on a hot plate at 300° C. for 90 seconds to form a resist underlayer film (film thickness: 60 nm). These resist underlayer films were immersed in a PGME/PGMEA mixed solvent (mass mixing ratio: 70/30) as a solvent used for a photoresist solution. In a case of being insoluble in the solvent, it was determined as "○" and shown in Table 1.

TABLE 1

| | Solvent resistance |
|---|---|
| Example 1 | ○ |
| Example 2 | ○ |
| Example 3 | ○ |
| Example 4 | ○ |
| Example 5 | ○ |
| Example 6 | ○ |
| Example 7 | ○ |
| Example 8 | ○ |
| Example 9 | ○ |
| Example 10 | ○ |
| Example 11 | ○ |
| Example 12 | ○ |
| Comparative Example 1 | ○ |

(Measurement of Optical Constant)

Each of the solutions of the resist underlayer film-forming composition prepared in Examples 1 to 12 and Comparative Example 1 was applied onto a silicon wafer using a spin coater. Baking was performed on a hot plate at 40° C. for 90 seconds to form a resist underlayer film (film thickness: 50 nm). A refractive index (n value) and an optical absorption coefficient (also referred to as a k value or an attenuation coefficient) of the resist underlayer film at a wavelength of 193 nm were measured using a spectroscopic ellipsometer. The results are shown in Table 2.

TABLE 2

| | n/k 193 nm |
|---|---|
| Example 1 | 1.40/0.42 |
| Example 2 | 1.42/0.48 |
| Example 3 | 1.45/0.54 |
| Example 4 | 1.43/0.47 |
| Example 5 | 1.50/0.60 |
| Example 6 | 1.43/0.45 |
| Example 7 | 1.48/0.54 |
| Example 8 | 1.41/0.42 |
| Example 9 | 1.42/0.48 |
| Example 10 | 1.41/0.41 |
| Example 11 | 1.40/0.47 |
| Example 12 | 1.38/0.46 |
| Comparative Example 1 | 1.48/0.54 |

Using each of the resist underlayer film-forming compositions prepared in Examples 1 to 12 and Comparative Example 1, a resist underlayer film was formed on a silicon wafer by the same method as described above. Then, the dry etching rate of these resist underlayer films was determined using RIE-10NR (manufactured by Samco Inc.) under the condition in which $O_2/N_2$ was used as an etching gas. While the dry etching rate of Comparative Example 1 was taken as 1.00, the dry etching rate of each of the resist underlayer films was calculated. The results are shown in Table 3 as "Relative dry etching rate".

TABLE 3

| | Etching rate |
|---|---|
| Example 1 | 1.62 |
| Example 2 | 1.52 |
| Example 3 | 1.32 |
| Example 4 | 1.61 |
| Example 5 | 1.24 |
| Example 6 | 1.50 |
| Example 7 | 1.44 |
| Example 8 | 1.67 |
| Example 9 | 1.59 |
| Example 10 | 1.44 |
| Example 11 | 1.38 |
| Example 12 | 1.26 |
| Comparative Example 1 | 1.00 |

As shown above, it is possible to freely control the etching resistance of the resist underlayer film by changing the type of the polymer.

(Measurement of Amount of Sublimate of Resist Underlayer Film)

The amount of the sublimate was measured using a sublimate amount measuring apparatus described in WO 2007/111147 A. Each of the resist underlayer film-forming compositions prepared in Examples 1 to 12 and Comparative Example 2 was applied onto a silicon wafer, and the amount of the sublimate was determined when the film thickness reached 50 nm after baking at 400° C. for 90 seconds. The results are shown in Table 4. Note that the value shown in the table is a value of (amount of sublimate of each of Examples 1 to 12)/(amount of sublimate of Comparative Example 2).

TABLE 4

| | Amount of sublimate |
|---|---|
| Example 1 | — |
| Example 2 | 0.07 |
| Example 3 | 0.06 |
| Example 4 | 0.30 |
| Example 5 | 0.94 |
| Example 6 | — |
| Example 7 | 0.63 |
| Example 8 | 0.02 |
| Example 9 | 0.59 |
| Example 10 | 0.08 |
| Example 11 | 0.21 |
| Example 12 | 0.09 |
| Comparative Example 2 | 1.00 |

(Hardness Test)

Each of the resist underlayer film-forming compositions prepared in Examples 1 to 12 and Comparative Example 1 was applied onto a silicon wafer, and baking was performed at 400° C. for 90 seconds, thereby forming a resist underlayer film having a thickness of 200 nm. An elastic modulus and hardness of the cured resist film were evaluated by TI-980 triboidentor manufactured by Bruker Corporation. The results are shown in Table 5.

TABLE 5

| | Hardness (GPa) |
|---|---|
| Example 1 | 1.02 |
| Example 2 | 0.91 |
| Example 3 | 0.73 |
| Example 4 | 0.87 |
| Example 5 | 0.71 |
| Example 6 | 0.78 |
| Example 7 | 0.78 |
| Example 8 | 0.97 |
| Example 9 | 0.91 |
| Example 10 | 1.02 |
| Example 11 | 1.01 |
| Example 12 | 0.97 |
| Comparative Example 1 | 0.54 |

As shown above, it is possible to significantly increase the hardness of the resist underlayer film by using the materials having a crosslinked structure in the polymer.

<Film Formation Test Under Nitrogen Atmosphere>

(Measurement of Film Shrinkage Ratio)

Each of the resist underlayer film-forming compositions prepared in Example 4 and Comparative Examples 1 and 2 was applied onto a silicon wafer using a spinner. Thereafter, baking was performed on a hot plate in the air at 350° C. for 1 minute to form a resist underlayer film (film thickness: about 0.25 μm), and then film thickness A was determined. The substrate was further baked at 450° C. for 90 seconds or at 600° C. for 5 minutes under a nitrogen atmosphere, and film thickness B was determined. The value of film thickness B/film thickness A×100 was defined as film shrinkage ratio.

When the films baked under the same baking conditions were compared, the underlayer films obtained using the resist underlayer film-forming composition prepared in Example 4 gave a smaller film shrinkage ratios than did the underlayer films obtained using each of the resist underlayer film-forming compositions prepared in Comparative Example 1 or 2. This would be advantageous in providing a smaller amount of sublimate and reduced device contamination. Also, a smaller shrinkage ratio would be advantageous for in-plane uniformity of the film.

TABLE 6

| | Baking conditions | Film shrinkage ratio |
|---|---|---|
| Example 4 | 350° C./60 seconds + 450° C./90 seconds_under $N_2$ atmosphere | 1% |
| Comparative Example 1 | 350° C./60 seconds + 450° C./90 seconds_under $N_2$ atmosphere | 9% |
| Comparative Example 2 | 350° C./60 seconds + 450° C./90 seconds_under $N_2$ atmosphere | 9% |
| Example 4 | 350° C./60 seconds + 600° C./5 minutes_under $N_2$ atmosphere | 26% |
| Comparative Example 1 | 350° C./60 seconds + 600° C./5 minutes_under $N_2$ atmosphere | 47% |
| Comparative Example 2 | 350° C./60 seconds + 600° C./5 minutes_under $N_2$ atmosphere | 33% |

(Hardness Test)

Using each of the resist underlayer film-forming compositions prepared in Example 4 and Comparative Examples 1 and 2, a resist underlayer film was formed on a silicon wafer by the same method as described above. A nanoindentation test was performed with a nanoindenter manufactured by TOYO Corporation, and the hardness of the resist underlayer film was determined. When the films baked under the same baking conditions were compared, Example 4 provided a higher hardness than did Comparative Examples 1 and 2 even in baking under a nitrogen atmosphere, and thus it was shown that Example 4 was advantageous for processing by etching.

TABLE 7

| | Baking conditions | Hardness |
|---|---|---|
| Example 4 | 350° C./60 seconds + 450° C./90 seconds_under $N_2$ atmosphere | 1.15 |
| Comparative Example 1 | 350° C./60 seconds + 450° C./90 seconds_under $N_2$ atmosphere | 0.57 |
| Comparative Example 2 | 350° C./60 seconds + 450° C./90 seconds_under $N_2$ atmosphere | 0.42 |
| Example 4 | 350° C./60 seconds + 600° C./5 minutes_under $N_2$ atmosphere | 2.09 |
| Comparative Example 1 | 350° C./60 seconds + 600° C./5 minutes_under $N_2$ atmosphere | 1.48 |
| Comparative Example 2 | 350° C./60 seconds + 600° C./5 minutes_under $N_2$ atmosphere | 1.45 |

(Measurement of Dry Etching Rate)

Each of the resist underlayer film-forming compositions prepared in Example 4 and Comparative Examples 1 and 2 was applied onto a silicon wafer using a spinner. Thereafter, baking was performed on a hot plate at 350° C. for 1 minute, and then baking was performed at 450° C. for 90 seconds or at 600° C. for 5 minutes in a nitrogen atmosphere, to form a resist underlayer film (film thickness: 0.2 μm). Then, dry etching rate of these resist underlayer films was determined using RIE system manufactured by Samco Inc. under the condition in which $CF_4$ was used as a dry etching gas.

While the dry etching rate (E.R.) of the film baked at 400° C. for 90 seconds in Comparative Example 2 was taken as 1.00, the dry etching rate was calculated. The results are shown in Table 8 as "Relative dry etching rate". The resist underlayer film formed in Example 4 baked at 600° C. for 5 minutes exhibited a low E.R., while maintaining such properties as a low film shrinkage ratio and high hardness, so that the film would have high etching resistance and be advantageous for processing by etching.

TABLE 8

| | Baking conditions | $CF_4$_etching rate |
|---|---|---|
| Example 4 | 350° C./60 seconds + 450° C./90 seconds_under $N_2$ atmosphere | 1.32 |
| Comparative Example 1 | 350° C./60 seconds + 450° C./90 seconds_under $N_2$ atmosphere | 0.94 |
| Comparative Example 2 | 350° C./60 seconds + 450° C./90 seconds_under $N_2$ atmosphere | 0.90 |
| Example 4 | 350° C./60 seconds + 600° C./5 minutes_under $N_2$ atmosphere | 1.10 |
| Comparative Example 1 | 350° C./60 seconds + 600° C./5 minutes_under $N_2$ atmosphere | 1.22 |
| Comparative Example 2 | 350° C./60 seconds + 600° C./5 minutes_under $N_2$ atmosphere | 0.94 |

INDUSTRIAL APPLICABILITY

According to the present invention, there is provided a novel resist underlayer film-forming composition that meets such requirements as reduced amount of sublimate that would contaminate a device, etching resistance in substrate processing, and bending resistance of the resulting resist underlayer film, particularly high hardness, while maintaining the other desirable properties.

The invention claimed is:

1. A resist underlayer film-forming composition comprising: a solvent and a polymer (X) having structural units, which are the same as or different from each other and have a hydroxymethyl group and an $ROCH_2$— group (R is a monovalent organic group or a mixture of two or more thereof), and a linking group linking the structural units.

2. The resist underlayer film-forming composition according to claim 1, wherein R is a saturated or unsaturated and linear or branched $C_2$-$C_{20}$ aliphatic hydrocarbon group or $C_3$-$C_{20}$ alicyclic hydrocarbon group, which is optionally substituted with a phenyl group, a naphthyl group, or an anthracenyl group and is optionally interrupted by an oxygen atom or a carbonyl group; a hydrogen atom; or a mixture thereof.

3. The resist underlayer film-forming composition according to claim 1, wherein the linking group contains an alkylene group or an ether group.

4. The resist underlayer film-forming composition according to claim 1, wherein the structural unit has an aromatic ring, a heterocyclic ring, or a fused ring, which optionally has a phenolic hydroxy group and optionally has a substituted or unsubstituted amino group.

5. The resist underlayer film-forming composition according to claim 1, further comprising a film material (Y) capable of carrying out a crosslinking reaction with the polymer (X).

6. The resist underlayer film-forming composition according to claim 1, further comprising a crosslinking agent.

7. The resist underlayer film-forming composition according to claim 1, further comprising an acid and/or an acid generator.

8. The resist underlayer film-forming composition according to claim 1, further comprising a surfactant.

9. The resist underlayer film-forming composition according to claim 1, wherein the solvent includes a solvent having a boiling point of 160° C. or higher.

10. A resist underlayer film which is a baked product of a coating film of the composition according to claim 1.

11. A method of manufacturing a semiconductor device, the method comprising:

forming a resist underlayer film using the composition according to claim 1 on a semiconductor substrate;

forming a resist film on the formed resist underlayer film;

forming a resist pattern by irradiating the formed resist film with a light or electron beam and developing the resist film;

etching and patterning the resist underlayer film through the formed resist pattern; and processing the semiconductor substrate through the patterned resist underlayer film.

12. A method of manufacturing a semiconductor device, the method comprising:

forming a resist underlayer film using the composition according to claim 1 on a semiconductor substrate;

forming a hard mask on the formed resist underlayer film;

forming a resist film on the formed hard mask;

forming a resist pattern by irradiating the formed resist film with a light or electron beam and developing the resist film;

etching and patterning the hard mask through the formed resist pattern;

etching and patterning the resist underlayer film through the patterned hard mask; and processing the semiconductor substrate through the patterned resist underlayer film.

* * * * *